(12) United States Patent
Notarianni et al.

(10) Patent No.: US 10,943,825 B2
(45) Date of Patent: Mar. 9, 2021

(54) METHOD FOR DICING DIE ATTACH FILM

(71) Applicant: Plasma-Therm LLC, St. Petersburg, FL (US)

(72) Inventors: Marco Notarianni, Tampa, FL (US); Leslie Michael Lea, East Hagbourne (GB); Russell Westerman, Land O'Lakes, FL (US)

(73) Assignee: Plasma-Therm LLC, St. Petersburg, FL (US)

( * ) Notice: Subject to any disclaimer, the term of this patent is extended or adjusted under 35 U.S.C. 154(b) by 0 days.

(21) Appl. No.: 16/358,017

(22) Filed: Mar. 19, 2019

(65) Prior Publication Data
US 2020/0083084 A1 Mar. 12, 2020

Related U.S. Application Data

(60) Provisional application No. 62/680,145, filed on Jun. 4, 2018, provisional application No. 62/721,380, filed on Aug. 22, 2018.

(51) Int. Cl.
*H01L 21/78* (2006.01)
*H01L 21/683* (2006.01)
*H01L 21/3065* (2006.01)

(52) U.S. Cl.
CPC .......... *H01L 21/78* (2013.01); *H01L 21/3065* (2013.01); *H01L 21/6836* (2013.01); *H01L 2221/68327* (2013.01)

(58) Field of Classification Search
None
See application file for complete search history.

(56) References Cited

U.S. PATENT DOCUMENTS

| 4,171,240 | A | 10/1979 | Wong |
| 6,642,127 | B2 | 11/2003 | Kumar et al. |
| 2010/0048001 | A1 | 2/2010 | Harikai et al. |
| 2012/0322241 | A1 | 12/2012 | Holden et al. |
| 2014/0094018 | A1 | 4/2014 | Falvo et al. |

(Continued)

FOREIGN PATENT DOCUMENTS

WO  WO 2004066382 A1  8/2004

OTHER PUBLICATIONS

"Etch Stop Materials for Release by Vapor HF Etching" by Bakke et al. (Year: 2005) 16th MicroMechanics Europe Workshop, MME 2005. Proceedings.*

(Continued)

*Primary Examiner* — Bradley Smith
(74) *Attorney, Agent, or Firm* — Burr & Forman LLP; Harvey S. Kauget

(57) ABSTRACT

The present invention provides a method for dicing a substrate on a composite film. A work piece having a support film, a frame and a substrate is provided. The substrate has a top surface and a bottom surface. The top surface of the substrate has at least one die region and at least one street region. The composite film is interposed between the substrate and the support film. Substrate material is etched from the at least one street region to expose a portion of the composite film using a substrate etch process. A first component of the composite film is etched using a first etch process. A second component of the exposed portion of the composite film is plasma etched using a second etch process.

5 Claims, 17 Drawing Sheets

(56) References Cited

U.S. PATENT DOCUMENTS

| | | | |
|---|---|---|---|
| 2015/0162244 A1 | 6/2015 | Holden et al. | |
| 2015/0270121 A1* | 9/2015 | Pays-Volard | H01J 37/32009 438/5 |
| 2019/0181113 A1* | 6/2019 | Morita | H01L 24/29 |

OTHER PUBLICATIONS

Van Zant "Microchip fabrication: a practical guide to semiconductor processing" p. 263 (2000).*

Hopfe V. et al: "Atmospheric-pressure plasmas for wide-area thin-film deposition and etching", Plasma Processes and Polymers, Wiley-VCH Germany, vol. 4 No. 3, Apr. 23, 2007, pp. 253-265, XP002793024 ISSN: 1612-8850, abstract.

* cited by examiner

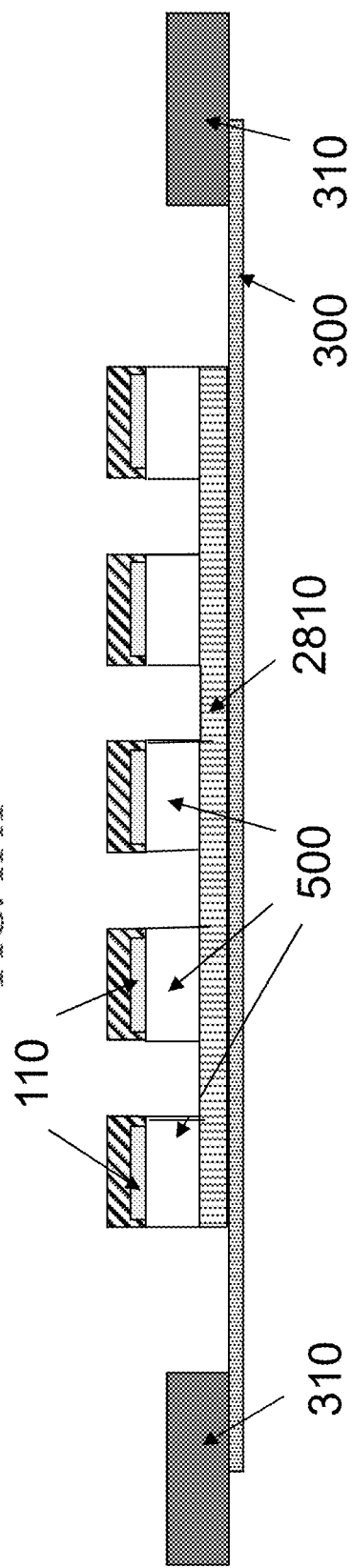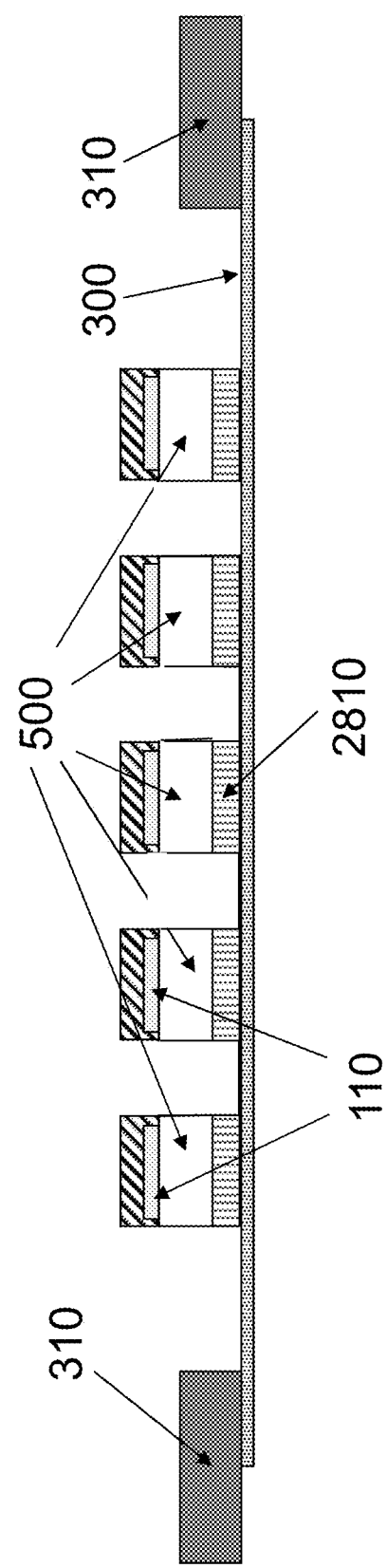

METHOD FOR DICING DIE ATTACH FILM

CROSS REFERENCES TO RELATED APPLICATIONS

This application claims priority from and is related to commonly owned U.S. Provisional Patent Application Ser. No. 62/680,145 filed Jun. 4, 2018, entitled: METHOD FOR DICING DIE ATTACH FILM and U.S. Provisional Patent Application Ser. No. 62/721,380 filed Aug. 22, 2018, entitled: METHOD FOR DICING DIE ATTACH FILM, these Provisional Patent Applications incorporated by reference herein.

FIELD OF THE INVENTION

The invention relates to the use of an apparatus for the formation of individual device chips from a semi-conductor wafer and a die attach film.

BACKGROUND

Semi-conductor devices are fabricated on substrates which are in the form of thin wafers. Silicon is commonly used as the substrate material, but other materials, such as III-V compounds (for example GaAs and InP) are also used. In some instances (for example, the manufacture of LED's) the substrate can be a sapphire or silicon carbide wafer on which a thin layer of a semi-conducting material is deposited. The diameter of such substrates range from 2 inches and 3 inches up to 200 mm, 300 mm, and 450 mm and many standards exist (e.g., SEMI) to describe such substrate sizes.

Plasma etching equipment is used extensively in the processing of these substrates to produce semi-conductor devices. Such equipment typically includes a vacuum chamber fitted with a high density plasma source such as Inductively Coupled Plasma (ICP) which is used to ensure high etch rates, necessary for cost-effective manufacturing. In order to remove the heat generated during the processing, the substrate is typically clamped to a temperature controlled support. A pressurized fluid, typically a gas such as Helium is maintained between the substrate and the support to provide a thermal conductance path for heat transfer. A mechanical clamping mechanism, in which a downward force is applied to the top side of the substrate, may be used, though this may cause contamination due to the contact between the clamp and the substrate. Work piece bowing may also occur when using a mechanical clamp, since contact is typically made at the edge of the work piece and a pressurized fluid exerts a force on the back of the work piece. More frequently an electrostatic chuck (ESC) is used to provide the clamping force.

Numerous gas chemistries appropriate to the material to be etched have been developed. These frequently employ a halogen (e.g., Fluorine, Chlorine, Bromine, Iodine, etc.) or halogen-containing gas together with additional gases added to improve the quality of the etch (for example, etch anisotropy, mask selectivity and etch uniformity). Fluorine containing gases, such as $SF_6$, $F_2$ or $NF_3$ are used to etch silicon at a high rate. In particular, a process (Bosch or TDM) which alternates a high rate silicon etch step with a passivation step to control the etch sidewall, is commonly used to etch deep features into silicon. Chlorine and Bromine containing gases are commonly used to etch III-V materials.

Plasma etching is not limited to semiconducting substrates and devices. The technique may be applied to any substrate type where a suitable gas chemistry to etch the substrate is available. Other substrate types may include carbon containing substrates (including polymeric substrates), ceramic substrates (e.g., AlTiC and sapphire), metal substrates, and glass substrates.

To ensure consistent results, low breakage and ease of operation, robotic wafer handling is typically used in the manufacturing process. Handlers are typically designed to support the wafers with minimal contact, to minimize possible contamination and reduce the generation of particulates. Edge contact alone, or underside contact close to the wafer edge at only a few locations (typically within 3-6 mm of the wafer edge) is often employed. Handling schemes, which include wafer cassettes, robotic arms and within process chamber fixtures including the wafer support and ESC, are designed to handle the standard wafer sizes as noted previously.

After fabrication on the substrate, the individual devices (die or chips) are typically separated from each other prior to packaging or being employed in other electronic circuitry. For many years, mechanical means have been used to separate the die from each other. Such mechanical means have included breaking the wafer along scribe lines aligned with the substrate crystal axis or by using a high speed diamond saw to saw into or through the substrate in a region (streets) between the die. More recently, lasers have also been used to facilitate the scribing and dicing process.

Such mechanical wafer dicing techniques have limitations which affect the cost effectiveness of this approach. Chipping and breakage along the die edges can reduce the number of good die produced, and the process becomes more problematic as wafer thicknesses decrease. The area consumed by the saw bade (kerf) may be greater than 100 microns which is valuable area not useable for die production. For wafers containing small die (e.g., individual semiconductor devices with a die size of 500 microns by 500 microns) this can represent a loss of greater than 20%. Further, for wafers with many small die and hence numerous streets, the dicing time is increased, and productivity decreased, since each street is cut consecutively. Mechanical means are also limited to separation along straight lines and the production of square or oblong shaped chips. This may not represent the underlying device topology (e.g., a high power diode can be round) and so the rectilinear die format results in significant loss of useable substrate area. Laser dicing also has limitations by leaving residual material on the die surface or inducing stress into the die.

It is important to note that both sawing and laser dicing techniques are essentially serial operations. Consequently, as device sizes decrease, the time to dice the wafer increases in proportion to the total dicing street length on the wafer.

Recently plasma etching techniques have been proposed as a means of separating die and overcoming some of these limitations. After device fabrication, the substrate can be masked with a suitable mask material, leaving open areas between the die. The masked substrate can be then processed using a reactive-gas plasma which etches the substrate material exposed between the die. The plasma etching of the substrate may proceed partially or completely through the substrate. In the case of a partial plasma etch, the die can be separated by a subsequent cleaving step, leaving the individual die separated. The technique offers a number of benefits over mechanical dicing:

1) Breakage and chipping is reduced;
2) The kerf dimensions can be reduced to well below 20 microns;

3) Processing time does not increase significantly as the number of die increases;

4) Processing time is reduced for thinner wafers; and

5) Die topology is not limited to a rectilinear format.

After device fabrication, but prior to die separation, the substrate may be thinned by mechanical grinding or similar process down to a thickness of a few hundred microns, or even less than a hundred microns.

Prior to the dicing process, the substrate is typically mounted on a dicing fixture. This fixture is typically comprised of a rigid frame that supports an adhesive support film. The substrate to be diced is adhered to the support film. This fixture holds the separated die for subsequent downstream operations. Most tools used for wafer dicing (saws or laser based tools) are designed to handle substrates in this configuration and a number of standard fixtures have been established; however, such fixtures are very different from the substrates which they support. Though such fixtures are optimized for use in current wafer dicing equipment, they cannot be processed in equipment which has been designed to process standard substrates. Thus, current automated plasma etching equipment is not suitable for processing substrates fixtured for dicing and it is difficult to realize the benefits that plasma etch techniques should have for die separation.

Some groups have contemplated using plasma to singulate die from wafer substrates. U.S. Pat. No. 6,642,127 describes a plasma dicing technique in which the substrate wafer is first attached to a carrier wafer via an adhesive material, before plasma processing in equipment designed for processing silicon wafers. This technique proposes adapting the form factor of the substrate to be diced to be compatible with standard wafer processing equipment. While this technique allows standard plasma equipment to dice the wafer, the proposed technique will not be compatible with standard equipment downstream of the dicing operation. Additional steps would be required to either adapt the downstream equipment or revert the substrate form factor for standard downstream equipment.

U.S. Patent Application No. 2010/0048001 contemplates the use of a wafer adhered to a thin membrane and supported within a frame. However, in the 2010/0048001 application, the masking process is achieved by adhering a mask material to the backside of the wafer and using a laser to define the etch streets prior to plasma processing. In contrast to standard dicing techniques which singulate the substrate from the front side, this technique introduces additional complex and expensive steps which may negate some of the advantages of plasma dicing. It also requires the additional demand of aligning the backside mask with the front side device pattern.

Therefore, what is needed is a plasma etching apparatus which can be used for dicing a semiconductor substrate into individual die and which is compatible with the established wafer dicing technique of handling a substrate mounted on support film and supported in a frame, and which is also compatible with standard front side masking techniques.

Nothing in the prior art provides the benefits attendant with the present invention.

Therefore, it is an object of the present invention to provide an improvement which overcomes the inadequacies of the prior art devices and which is a significant contribution to the advancement to the dicing of semiconductor substrates using a plasma etching apparatus.

Another object of the present invention is to provide a method for dicing a substrate on a composite film, the method comprising providing a work piece having a support film, a frame and a substrate, the substrate having a top surface and a bottom surface, the top surface of the substrate having at least one die region and at least one street region; providing the composite film interposed between the substrate and the support film; etching substrate material from the at least one street region to expose a portion of the composite film using a substrate etch process; etching a first component of the composite film using a first etch process; and plasma etching a second component of the exposed portion of the composite film using a second etch process.

Yet another object of the present invention is to provide a method for dicing a substrate on a die attach film, the method comprising providing a work piece having a support film, a frame and a substrate, the substrate having a top surface and a bottom surface, the top surface of the substrate having at least one die region and at least one street region; providing the die attach film interposed between the substrate and the support film; etching substrate material from the at least one street region to expose a portion of the die attach film using a substrate etch process; etching a first component of the die attach film using a first etch process; and plasma etching a second component of the exposed portion of the die attach film using a second etch process.

Still yet another object of the present invention is to provide a method for dicing a substrate on a die attach film, the method comprising providing a work piece having a support film, a frame and a substrate, the substrate having a top surface and a bottom surface, the top surface of the substrate having at least one die region and at least one street region; providing the die attach film interposed between the substrate and the support film; etching substrate material from the at least one street region to expose a portion of the die attach film using a substrate etch process; isotropically etching a first component of the die attach film using a first etch process; and anisotropically plasma etching a second component of the exposed portion of the die attach film using a second etch process.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The present invention describes a plasma processing apparatus which allows for plasma dicing of a semiconductor substrate. After device fabrication and any wafer thinning, the front side (circuit side) of the substrate can be masked using conventional masking techniques which protect the circuit components and leaves unprotected areas between the die. The substrate is mounted on a thin support film which is supported within a rigid frame. The substrate/support film/frame assembly is transferred into a vacuum processing chamber and exposed to reactive gas plasma where the unprotected areas between the die are etched away. During this process, the frame and support film are protected from damage by the reactive gas plasma. The processing can leave the die completely separated. After etching, the substrate/support film/frame assembly can be additionally exposed to plasma which removes potentially damaging residues from the substrate surface. After transfer of the substrate/support film/frame assembly out of the process chamber, the die are removed from the support film using well known techniques and are then further processed (e.g., packaged) as necessary.

Another feature of the present invention is to provide a method for dicing a substrate on a composite film. The method comprising providing a work piece having a support film, a frame and a substrate. The substrate has a top surface and a bottom surface. The top surface of the substrate has at least one die region and at least one street region. The composite film is interposed between the substrate and the support film. Substrate material is etched from the at least one street region to expose a portion of the composite film using a substrate etch process. A first component of the composite film is etched using a first etch process. A second component of the exposed portion of the composite film is plasma etched using a second etch process. The composite film can contain matrix-based materials. The first component can be a reinforcement component. The second component can be a matrix component. The first etch process can be at least partially isotropic. The first etch process can be isotropic. The first etch process can have a different process chemistry than the second etch process. The second etch process can be at least partially anisotropic. The second etch process can be anisotropic. The etching of the substrate material can be in a vacuum chamber and the etching of composite film can be in a vacuum chamber. The substrate can have a semiconducting layer such as Silicon and/or the substrate can have a layer such as GaAs. The substrate can have a protective layer such as a photoresist layer that is patterned on a circuit side of the substrate. The substrate can be placed in a process chamber on a work piece support. A plasma source can be in communication with the process chamber. The plasma source can be a high density plasma source. An electrostatic chuck can be incorporated into the work piece support. The electrostatic chuck can clamp the work piece to the work piece support. A thermal communication between the work piece and the work piece support can be provided by supplying a pressurized gas such as helium from the work piece support to the work piece. The pressure within the process chamber can be reduced through a vacuum pump and a process gas can be introduced into the process chamber through a gas inlet. A vacuum compatible transfer module can be provided that communicates with the process chamber. The work piece can be loaded onto a transfer arm in the vacuum compatible transfer module whereby the process chamber is maintained under vacuum during a transfer of the work piece from the vacuum compatible transfer module to the process chamber.

Yet another feature of the present invention is to provide a method for dicing a substrate on a die attach film. The method comprising providing a work piece having a support film, a frame and a substrate. The substrate has a top surface and a bottom surface. The top surface of the substrate has at least one die region and at least one street region. The die attach film is interposed between the substrate and the support film. Substrate material is etched from the at least one street region to expose a portion of the die attach film using a substrate etch process. A first component of the die attach film is etched using a first etch process. A second component of the exposed portion of the die attach film is plasma etched using a second etch process. The first etch process can be at least partially isotropic. The first etch process can be isotropic. The first etch process can have a different process chemistry than the second etch process. The second etch process can be at least partially anisotropic. The second etch process can be anisotropic. The substrate can contain a semiconducting layer such as Silicon and/or the substrate can contain a layer such as GaAs. The semiconducting layer is typically on the front side (e.g., circuit side) of the substrate. The substrate can have a protective layer such as a photoresist layer that is patterned on a circuit side of the substrate. The substrate can be placed in a process chamber on a work piece support. A plasma source can be in communication with the process chamber. The plasma source can be a high density plasma source. An electrostatic chuck can be incorporated into the work piece support. The electrostatic chuck can clamp the work piece to the work piece support. A thermal communication between the work piece and the work piece support can be provided by supplying a pressurized gas such as helium from the work piece support to the work piece. The pressure within the process chamber can be reduced through a vacuum pump and a process gas can be introduced into the process chamber through a gas inlet. A vacuum compatible transfer module can be provided that communicates with the process chamber. The work piece can be loaded onto a transfer arm in the vacuum compatible transfer module whereby the process chamber is maintained under vacuum during a transfer of the work piece from the vacuum compatible transfer module to the process chamber.

Still yet another feature of the present invention is to provide a method for dicing a substrate on a die attach film. The method comprising providing a work piece having a support film, a frame and a substrate. The substrate has a top surface and a bottom surface. The top surface of the substrate has at least one die region and at least one street region. The die attach film is interposed between the substrate and the support film. Substrate material is etched from the at least one street region to expose a portion of the die attach film using a substrate etch process. A first component of the die attach film is isotropically etched using a first etch process. A second component of the exposed portion of the die attach film is anisotropically plasma etched using a second etch process. The method can further comprise removing a portion of the die attach film during the step of etching substrate material from the at least one street region. The first etch process can use at least one different process gas than the second etch process. The first etch process can use different process gases than the second etch process. The substrate can contain a semiconducting layer such as Silicon and/or the substrate can contain a layer such as GaAs. The substrate can have a protective layer such as a photoresist layer that is patterned on a circuit side of the substrate. The substrate can be placed in a process chamber on a work piece support. A plasma source can be in communication with the process chamber. The plasma source can be a high density plasma source. An electrostatic chuck can be incorporated into the work piece support. The electrostatic chuck can clamp the work piece to the work piece support. A thermal communication between the work piece and the work piece support can be provided by supplying a pressurized gas such as helium from the work piece support to the work piece. The pressure within the process chamber can be reduced through a vacuum pump and a process gas can be introduced into the process chamber through a gas inlet. A vacuum compatible transfer module can be provided that communicates with the process chamber. The work piece can be loaded onto a transfer arm in the vacuum compatible transfer module whereby the process chamber is maintained under vacuum during a transfer of the work piece from the vacuum compatible transfer module to the process chamber.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIG. 11A is a schematic view of a work piece where substrate material has been removed in a street region;

FIG. 11B is a schematic view of a point in the dicing process flow where the composite film has been at least partially removed in the street regions;

Similar reference characters refer to similar parts throughout the several views of the drawings.

DETAILED DESCRIPTION OF THE INVENTION

Figure 1:
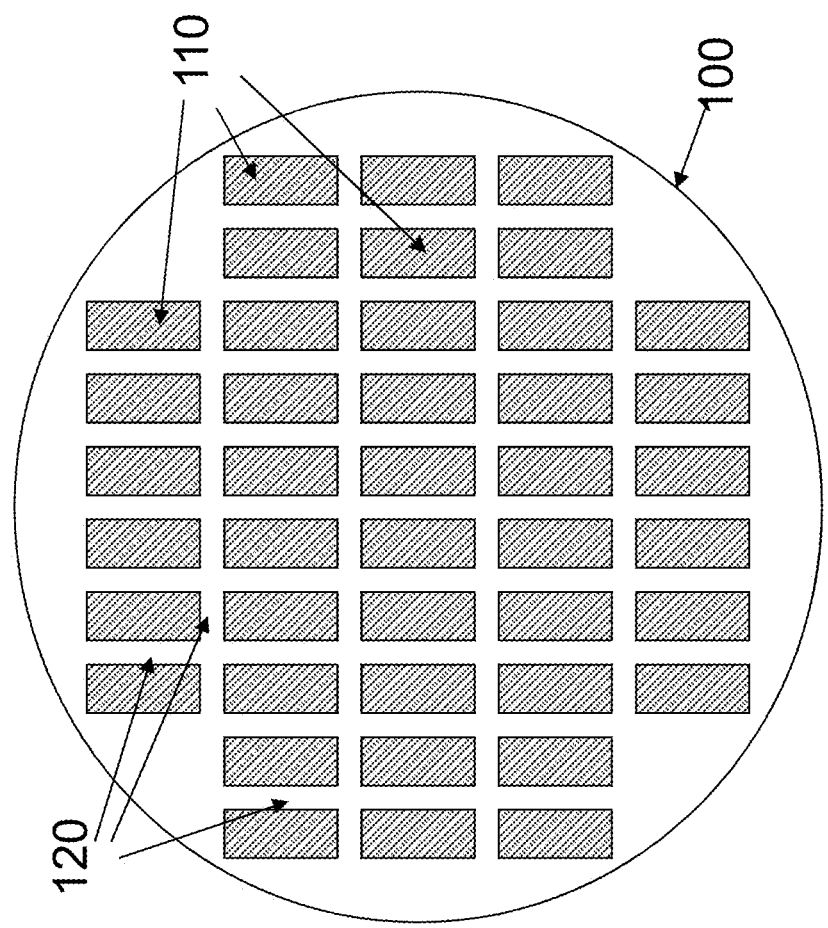
FIG. 1 is a top down view of a semiconductor substrate illustrating individual devices separated by streets.

A typical semiconductor substrate after device fabrication is illustrated in FIG. 1. The substrate (100) has on its surface a number of areas containing device structures (110) separated by street areas (120) which allows for separation of the device structures into individual die. Although silicon is commonly used as a substrate material, other materials chosen for their particular characteristics are frequently employed. Such substrate materials include Gallium Arsenide and other III-V materials or non-semi-conductor substrates on which a semi-conducting material has been deposited (e.g., a polymeric substrate with a thin film semiconductor device fabricated on the polymer). Further substrate types may also include Silicon-On-Insulator (SOI) wafers and semiconductor wafers mounted on carriers. While the example above describes die separated by streets, aspects of the invention may be beneficially applied to other pattern configurations on a substrate.

Figure 2:
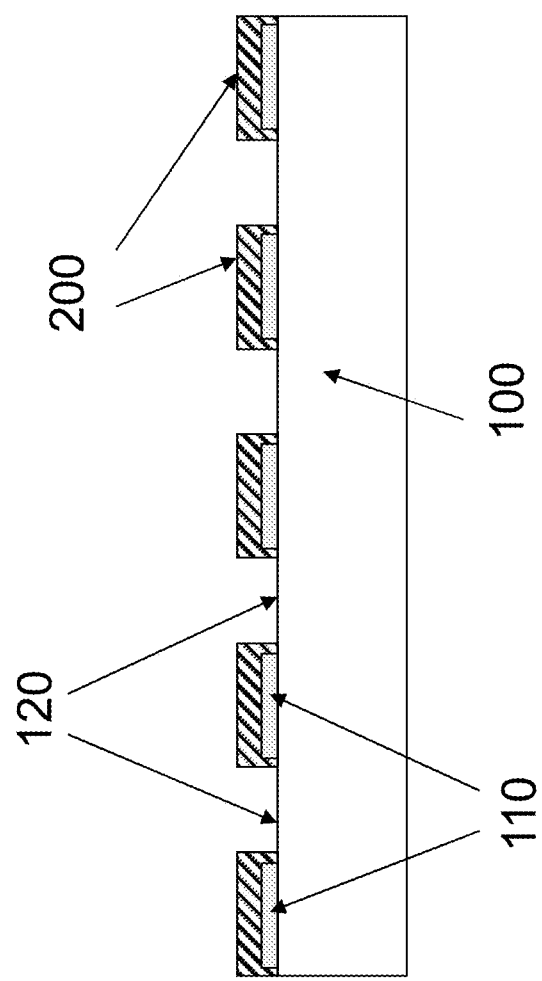
FIG. 2 is a cross-sectional view of a semiconductor substrate illustrating individual devices separated by streets.

In the present invention, as is shown in a cross sectional view in FIG. 2, the device structures (110) are then covered with a protective material (200) while the street areas (120) remain unprotected. This protective material (200) can be a photoresist, applied and patterned by well-known techniques. Some devices, as a final process step are coated with a protective dielectric layer such as silicon dioxide or PSG which can be applied across the whole substrate. This can be selectively removed from the street areas (120) by patterning with photoresist and etching the dielectric material, as is well known in the industry. This leaves the device structures (110) protected by the dielectric material and the substrate (100) substantially unprotected in the street areas (120). Note that in some cases test features to check the wafer quality may be located in the street areas (120). Depending on the specific wafer fabrication process flow, these test features may or may not be protected during the wafer dicing process. Although the device pattern illustrated shows oblong die, this is not necessary, and the individual device structures (110) may be any other shape, such as hexagons, as best suits the optimum utilization of the substrate (100). It is important to note that while the previous example considers dielectric materials as the protective film, that the invention may be practiced with a wide range of protective films including semi-conductive and conductive protective films. Furthermore, the protective layer can consist of multiple materials. It is also important to note that some portion of the protective film may be an integral part of the final device structure. (e.g., a passivation dielectric, metal bonding pad, etc.). Furthermore, the present invention can also be beneficially used with bulk wafers without the necessity of having devices or device structures. One such example may be a semiconductor substrate (Silicon, III-V compounds, etc.), mounted on a carrier or not mounted, covered by a masking material defining the structures to be etched. The substrate may also contain at least one additional layer with different material properties, such as for example an insulating layer.

Figure 3:
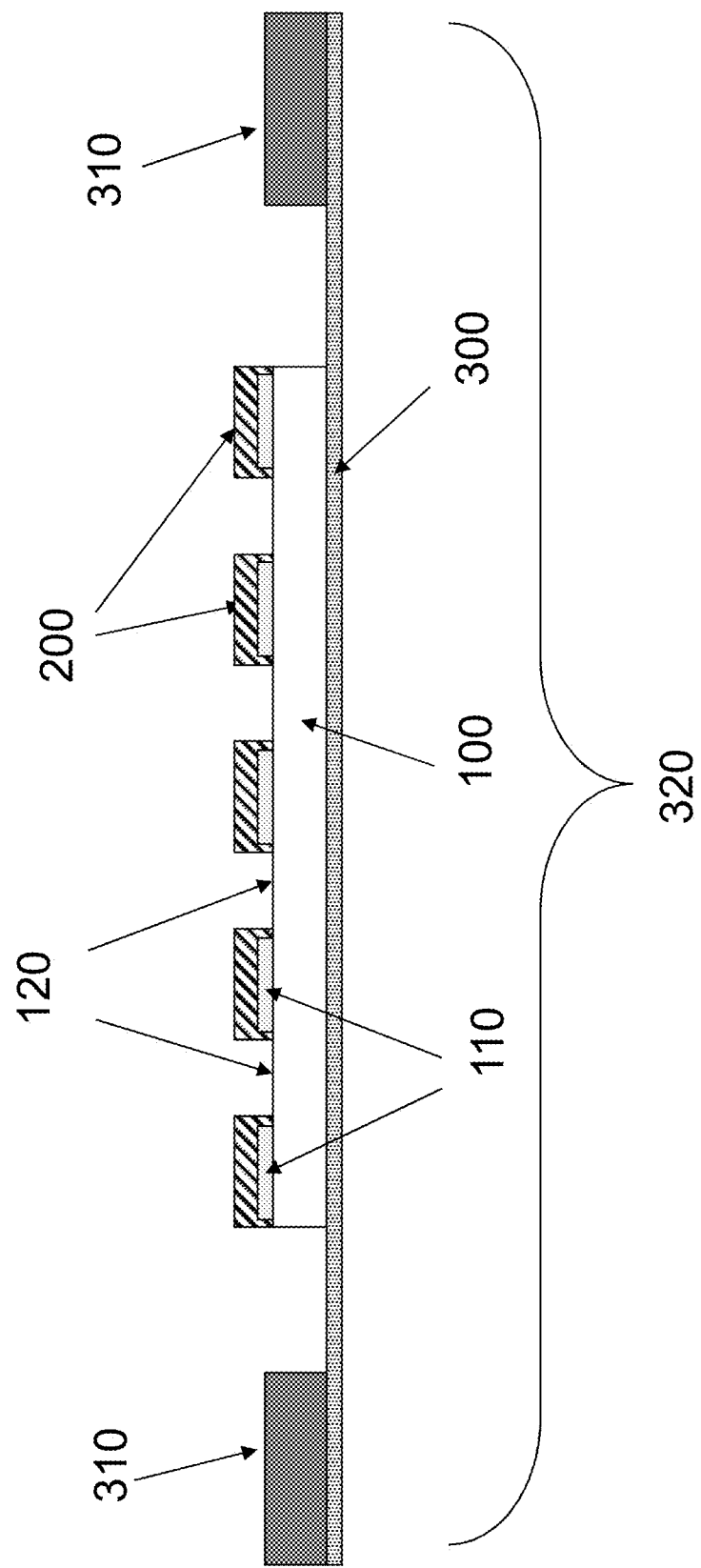
FIG. 3 is a cross-sectional view of a semiconductor substrate mounted to support film and a frame.

The substrate (100) may be thinned, typically by a grinding process, which reduces the substrate thickness to a thickness in the range of a few hundred microns to approximately 30 microns or less. As is shown in FIG. 3, the thinned substrate (100) is then adhered to a support film (300) which in turn is mounted in a rigid frame (310) to form a work piece (320). The frame is typically metal or plastic, though other frame materials are possible. The support film (300) is typically made from a carbon-containing polymer material, and may additionally have a thin conductive layer applied to its surface. The support film (300) provides support for the thinned substrate (100) which may otherwise be too fragile to handle without breakage. It should be noted that the sequence of patterning, thinning and then mounting is not critical and the steps may be adjusted to best fit the particular devices and substrate and the processing equipment used. It is important to note that while the previous example considers a work piece (320) that is comprised of mounting a substrate (100) on an adhesive support film (300) which in turn is attached to a frame (310), that the invention is not limited by the configuration of the wafer and carrier. The wafer carrier can be comprised a variety of materials. The carrier supports the substrate during the plasma dicing process. Furthermore, the wafer need not be attached to the carrier using an adhesive—any method that holds the wafer to the carrier and allows a means thermal communication of the substrate to the cathode is sufficient (e.g., an electrostatically clamped carrier, a carrier with a mechanical clamping mechanism, etc.).

Figure 4:
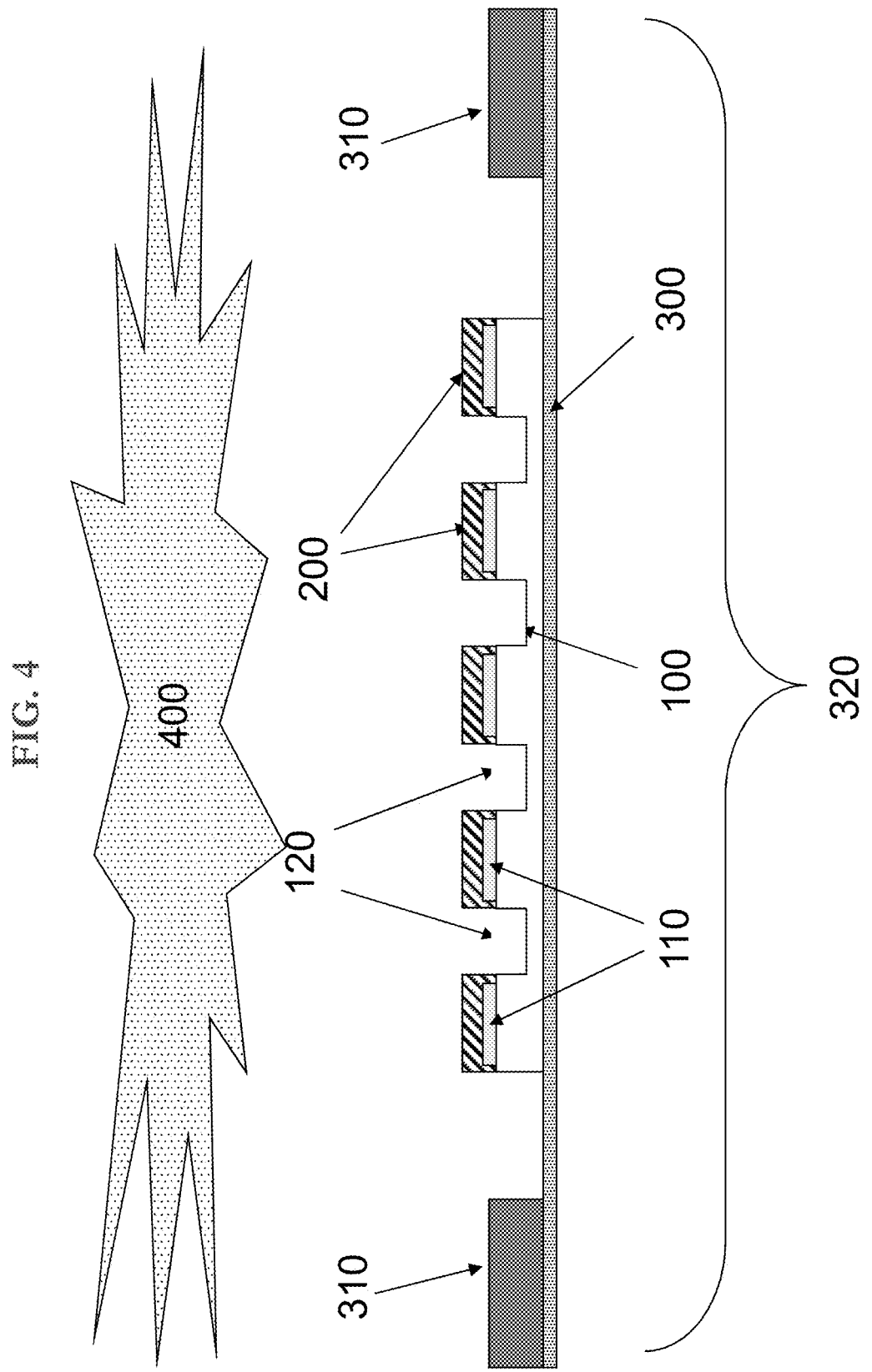
FIG. 4 is a cross-sectional view of a semiconductor substrate mounted to support film and a frame being etched by a process.
Figure 5:
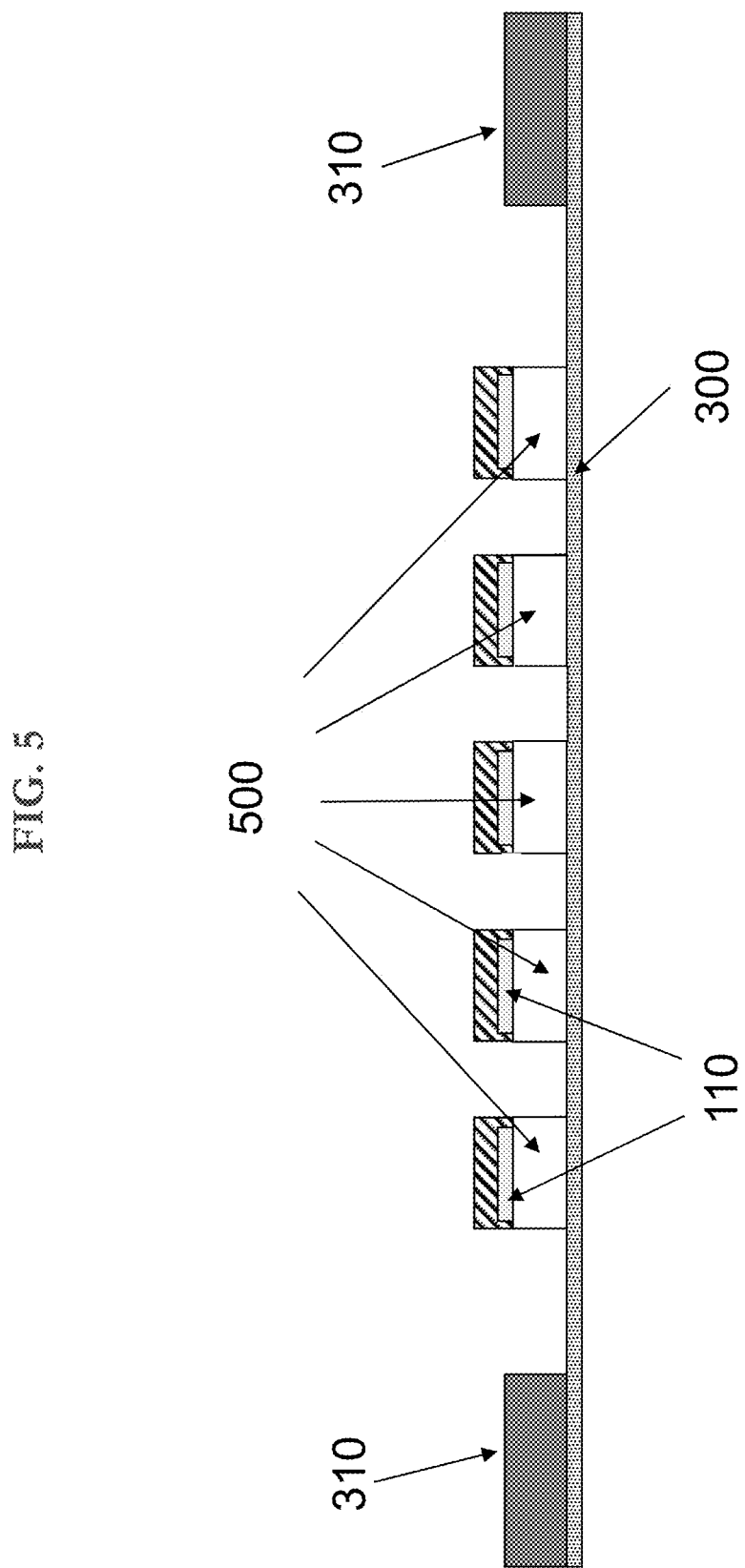
FIG. 5 is a cross-sectional view of separated semiconductor devices mounted to support film and a frame.
Figure 6:
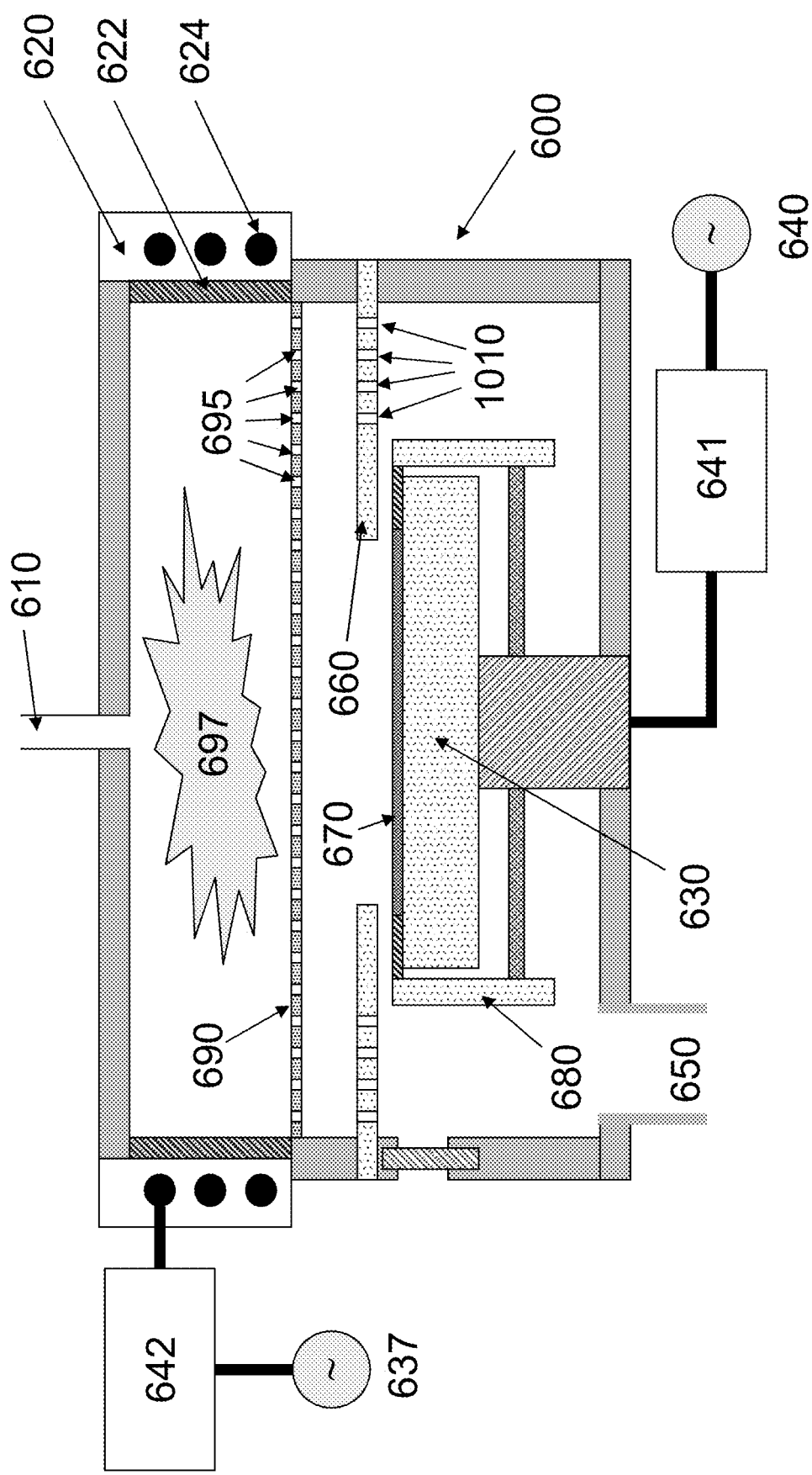
FIG. 6 is a cross-sectional view of a vacuum processing chamber.

After mounting the substrate (100) with the support film (300) in the dicing frame (310), the work piece (320) is transferred into a vacuum processing chamber. Preferably, the transfer module is also under vacuum which allows the process chamber to remain at vacuum during transfer, reducing processing time and preventing exposure of the process chamber to atmosphere and possible contamination. As shown in FIG. 6, the vacuum processing chamber (600) is equipped with a gas inlet (610), a high density plasma source (620) to generate a high density plasma, such as an Inductively Coupled Plasma (ICP), a work piece support (630) to support the work piece (320), an RF power source (640) to couple RF power to the work piece (320) through the work piece support (630) and a vacuum pump (650) for pumping gas from the processing chamber (600). During processing, the unprotected areas (120) of substrate (100) can be etched away using a reactive plasma etch process (400) as shown in FIG. 4. This can leave the devices (110) separated into individual die (500) as shown in FIG. 5. In another embodiment of the invention, the unprotected areas (120) of the substrate (100) are partially etched away using a reactive plasma etch process (400). In this case, a downstream operation, such as a mechanical breaking operation, can be used to complete the die separation. These downstream methods are well known in the art.

While the previous example describes the invention using a vacuum chamber in conjunction with a high density plasma (e.g., ECRs, ICP, helicon, and magnetically enhanced plasma sources), it is also possible to etch the unprotected areas of the substrate using a wide range of plasma processes. For example, one skilled in the art can imagine variations of the invention using a low density plasma source in a vacuum chamber or even the use of plasmas at or near atmospheric pressures.

Figure 7:
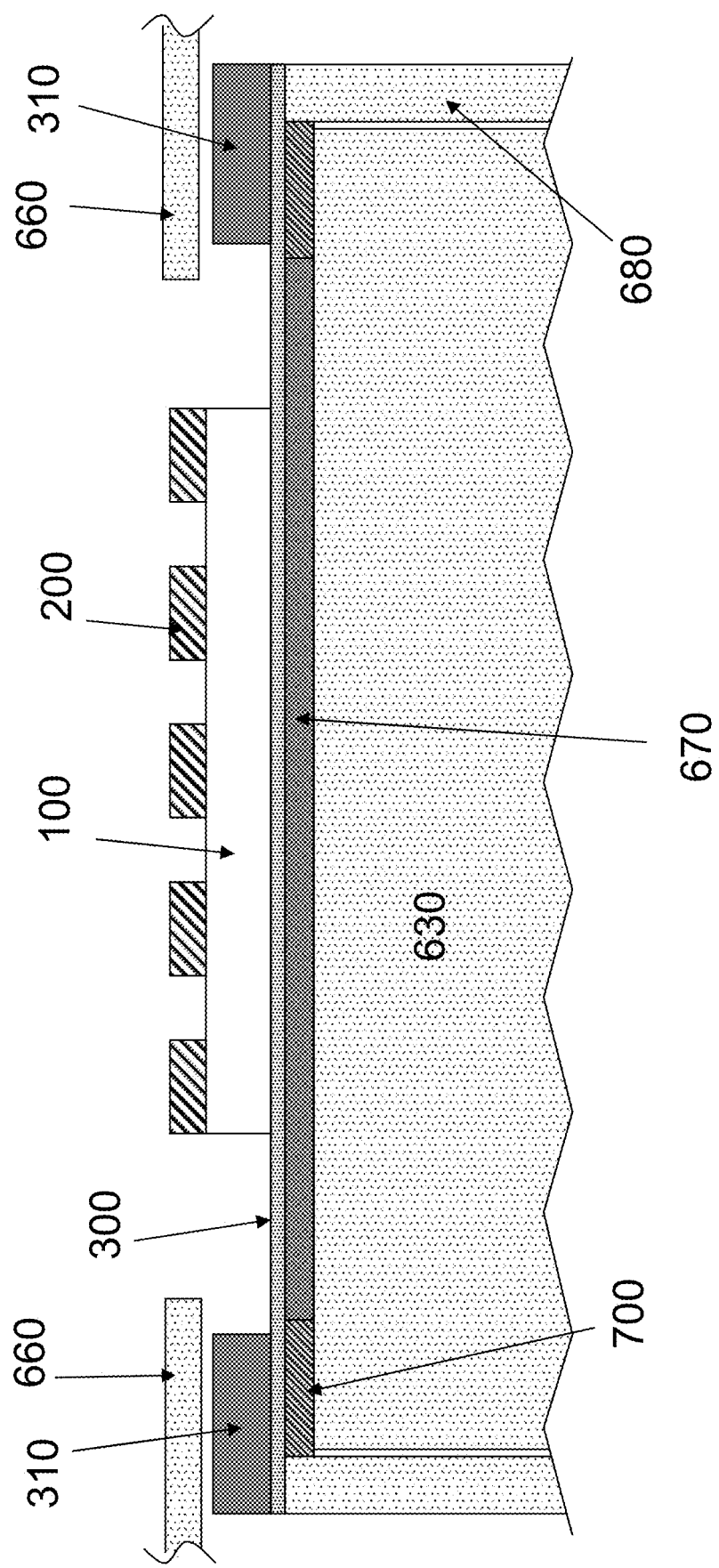
FIG. 7 is a cross-sectional of a wafer/frame in process position.
Figure 8:
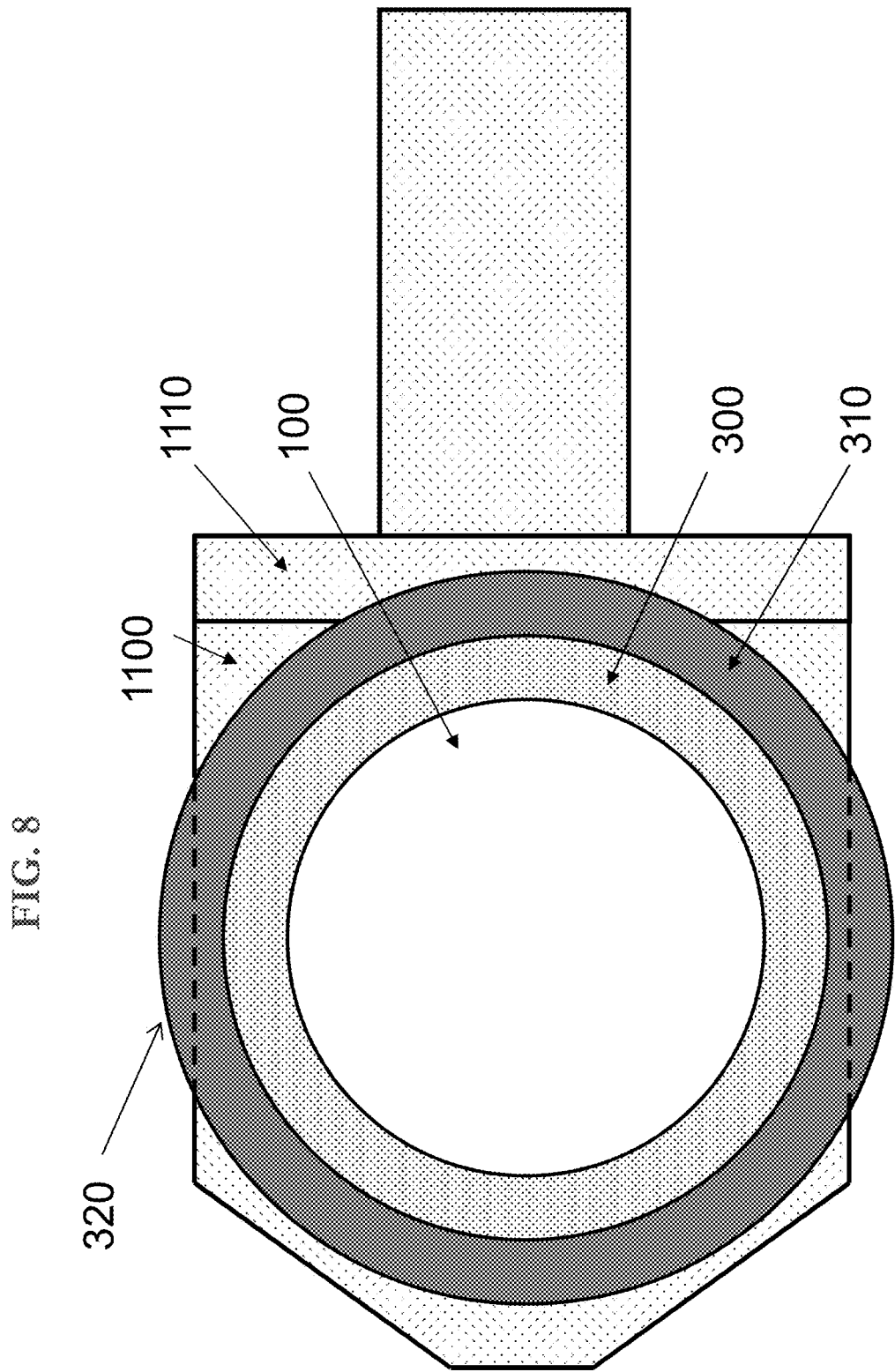
FIG. 8 is a cross-sectional view of a semiconductor substrate mounted to support film and a frame supported by a transfer arm.

When the work piece (substrate/tape/frame assembly) (320) is in the position for plasma processing, the frame (310) can be protected from exposure to the plasma (400). Exposure to the plasma (400) may cause heating of the frame (310) which in turn may cause local heating of the support film (300). For commonly used dicing tapes, at temperatures above approximately 100° C., the physical properties of the support film (300) and its adhesive capability may deteriorate and it will no longer adhere to the frame (310). Additionally, exposure of the frame (310) to the reactive plasma gas may cause degradation of the frame (310). Since the frame (310) is typically re-used after wafer dicing, this may limit the useful lifetime of a frame (310). Exposure of the frame (310) to the plasma (400) may also adversely affect the etch process: for example the frame material may react with the process gas, effectively reducing its concentration in the plasma which may reduce the etch rate of the substrate material, thus increasing process time. To protect the frame (310), a protective cover ring (660), as shown in FIGS. 6 and 7, is positioned above the frame (310). In one embodiment, the cover ring (660) does not touch the frame (310) since contact with the frame (310) (which would occur during transfer into the process chamber (600)) may generate undesirable particles.

The work piece (substrate/tape/frame assembly) (320) is transferred both into and out of the process chamber (600) by a transfer arm (1100) that supports the frame (310) and substrate (100). The transfer arm (1100) may support both the support film (300) and the frame (310) or the frame (310) alone, but it is important that the assembly (320) not be supported beneath the substrate (100) area alone because of the fragile nature of thinned substrates (100). The transfer arm (1100) has an alignment fixture (1110) attached to it that aligns the frame (310) in a repeatable position before being transferred into the process chamber (600). The frame (310) can also be aligned by other techniques well-known in semiconductor processing (e.g., optical alignment). The alignment can also be performed on the substrate (100) by such well-known techniques. It is important that the work piece (substrate/tape/frame assembly) (320) be aligned before placement within the process chamber (600) to avoid miss-processing as explained below.

Figure 9:
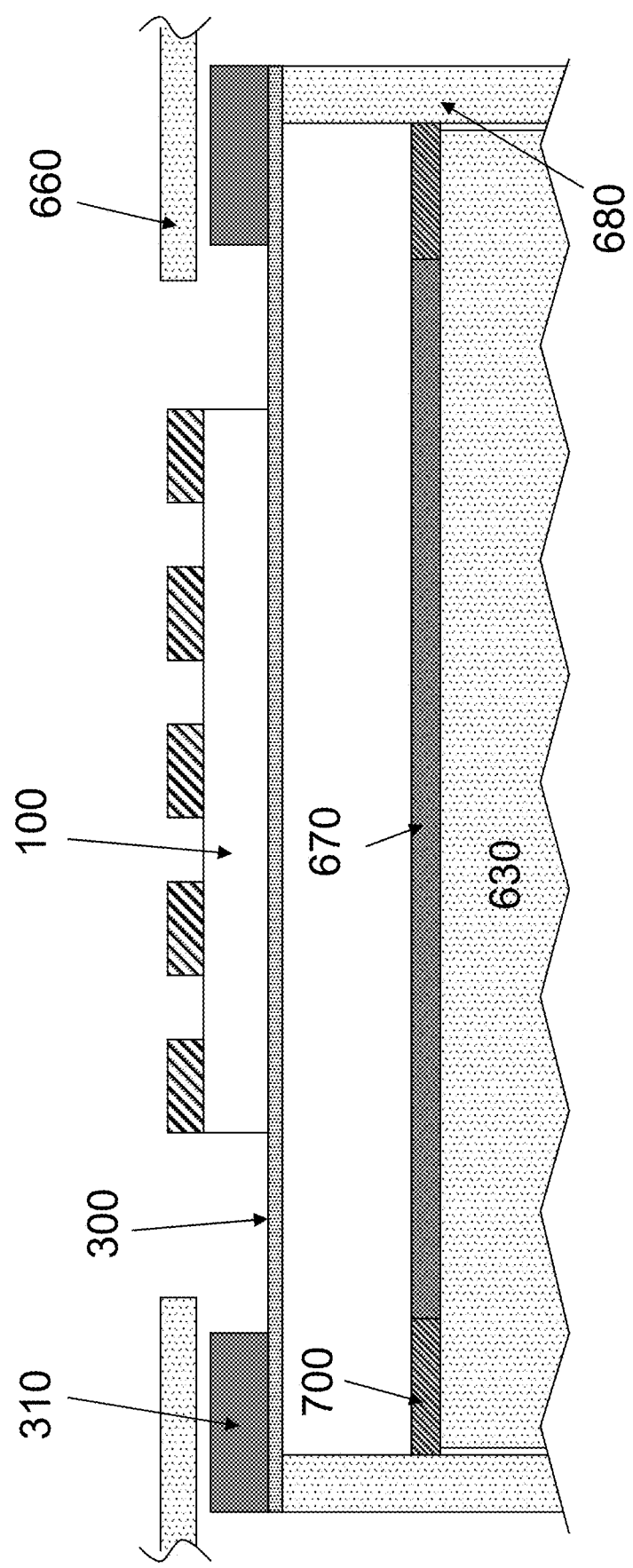
FIG. 9 is a cross-sectional view of a wafer/frame in a transfer position.

When the work piece (e.g., substrate/tape/frame assembly) (320) is transferred into the process chamber (600), it is placed onto the lifting mechanism (680) and removed from the transfer arm (1100). The reverse process occurs during transfer of the work piece (e.g., substrate/tape/frame assembly) (320) out of the process chamber (600). The lifting mechanism (680) touches the frame (310) area and provides no point contact to the substrate (100). Point contact to the work piece overlapping the substrate (100) can cause damage to the substrate (100), particularly after die separation and unloading of the work piece (320), since the flexibility of the support film (300) may cause the die to contact each other and damage to occur. FIG. 9 shows the lifting mechanism (680) lifting the frame (310) from the underside; however, the frame (310) can also be removed from the transfer arm (1100) by contact with the top surface, bottom surface, outer diameter of the frame (310) or any combination of these using a clamping device. In order to have enough clearance to place the work piece (320) on the work piece support (630) to process the substrate (100), the frame (310), the work piece support (630), and the cover ring (660) can move relative to each other. This can be accomplished by moving the cover ring (660), the work piece support (630), or the lifting mechanism (680) or any combination of the three.

During plasma processing, heat is transferred to all of the surfaces the plasma contacts including the substrate (100), support film (300), and frame (310). The cover ring (660) will minimize the heat transfer to areas of the support film (300) and the frame (310), but the substrate (100) must be exposed to the plasma (400) for processing.

As shown in FIG. 6, a perforated mechanical partition (690) may be interposed between the plasma source (620) and the work piece support (630). The mechanical partition (690) can be electrically conductive (e.g., made from metal or metal coated). The mechanical partition (690) can be made of Aluminum. The mechanical partition (690) can help reduce the ion density as well as the plasma emission intensity reaching the work piece, while allowing a high level of neutral species to reach the work piece. The present invention offers control over the ion density and plasma emission intensity reaching the work piece. It is preferred for applications relevant to this invention, that the ion density and plasma emission intensity from the plasma source (620) reaching the work piece be attenuated in the range of 10% to greater than 99% by the mechanical partition. In one preferred embodiment, the attenuation by the mechanical partition can be greater than 10%. In one preferred embodiment, the attenuation by the mechanical partition can be greater than 30%. In yet another preferred embodiment, the attenuation by the mechanical partition can be greater than 50%. In yet another preferred embodiment, the attenuation by the mechanical partition is greater than 90%.

While the schematic in FIG. 6 shows a process chamber (600) with one mechanical partition (690), it may be beneficial to have more than one mechanical partition (690) disposed between the plasma source (620) and the substrate (100). The mechanical partitions (690) can be the same size and shape, or can be different sizes and/or shapes. The multiple mechanical partitions (690) may be configured in the same plane or different planes (e.g., overlapped or stacked partitions). The multiple mechanical partitions (690) may have perforation shapes, sizes and patterns that are identical or different from one another.

The substrate can be processed using techniques well known in the semiconductor industry. Silicon substrates are generally processed using a Fluorine based chemistry, such as $SF_6$. $SF_6/O_2$ chemistry is commonly used to etch Silicon because of its high rate and anisotropic profile. A disadvantage of this chemistry is its relatively low selectivity to masking material for example to photoresist which is 15-20:1. Alternatively, a Timed Division Multiplex (TDM) process can be used which alternates between deposition and etching to produce highly anisotropic deep profiles. For example, an alternating process to etch Silicon uses a $C_4F_8$ step to deposit polymer on all exposed surfaces of the Silicon substrate (i.e., mask surface, etch sidewalls and etch floor) and then an $SF_6$ step is used to selectively remove the polymer from the etch floor and then isotropically etch a small amount of silicon. The steps can repeat until terminated. Such a TDM process can produce anisotropic features deep into Silicon with selectivities to the masking layer of greater than 200:1. This then makes a TDM process the desired approach for plasma separation of Silicon substrates. Note that the invention is not limited to the use of fluorine containing chemistries or a time division multiplex (TDM) process. For example, silicon substrates may also be etched with Cl, HBr or I-containing chemistries as is known in the art.

For III-V substrates such as GaAs, a Chlorine based chemistry is extensively used in the semiconductor industry. In the fabrication of RF-wireless devices, thinned GaAs substrates are mounted with the device side down onto a carrier, where they are then thinned and patterned with photoresist. The GaAs is etched away to expose electrical contacts to the front side circuitry. This well-known process can also be used to separate the devices by the front side processing described in the above mentioned invention. Other semiconductor substrates and appropriate plasma processes can also be used for the separation of die in the above mentioned invention.

While the above examples discuss the use of plasma for separating die (dicing), aspects of the invention may be useful for related applications such as substrate thinning by plasma etching. In this application the substrate (100) can be have some features on the surface to be etched or alternatively the surface to be etched may be featureless (e.g., thinning the bulk substrate).

Plasma dicing can efficiently singulate a wide ranges of devices. Some die structures however contain at least one composite layer that can be difficult to plasma etch without harming (e.g., damaging) the device. An example of such a structure would be a silicon device to be singulated that contains a die attach film (DAF). Die attach films are adhesive layers that can be used to bond chips to one another. The die can be singulated prior to the bonding operation. During integrated circuit device fabrication, DAF can be used to create multi-chip stacked packages.

In order to get the required mechanical and electrical film properties, die attach films (DAF) are often designed using composite materials. For example, a die attach film can consist of a polymeric matrix (e.g., epoxy resins, etc.) with embedded filler materials (e.g., $SiO_2$ particles, etc.). Both materials in this example (epoxy and $SiO_2$) are capable of being plasma etched. For example, the polymer matrix can be etched in an oxygen containing plasma. A silicon dioxide ($SiO_2$) component can also be plasma etched, though due to the strength of the silicon to oxygen bond, ion energy or higher wafer temperatures are often required to get a commercially viable $SiO_2$ plasma etch rate. While these higher ion energy and/or higher temperature conditions will etch an $SiO_2$ component in a DAF film, these conditions will also typically etch exposed materials of the device structure, potentially damaging the device (e.g., degrading device performance and/or yield). Therefore there is a need to be able to remove composite materials during a dicing process flow that does not significantly damage the singulated devices.

Figure 10:
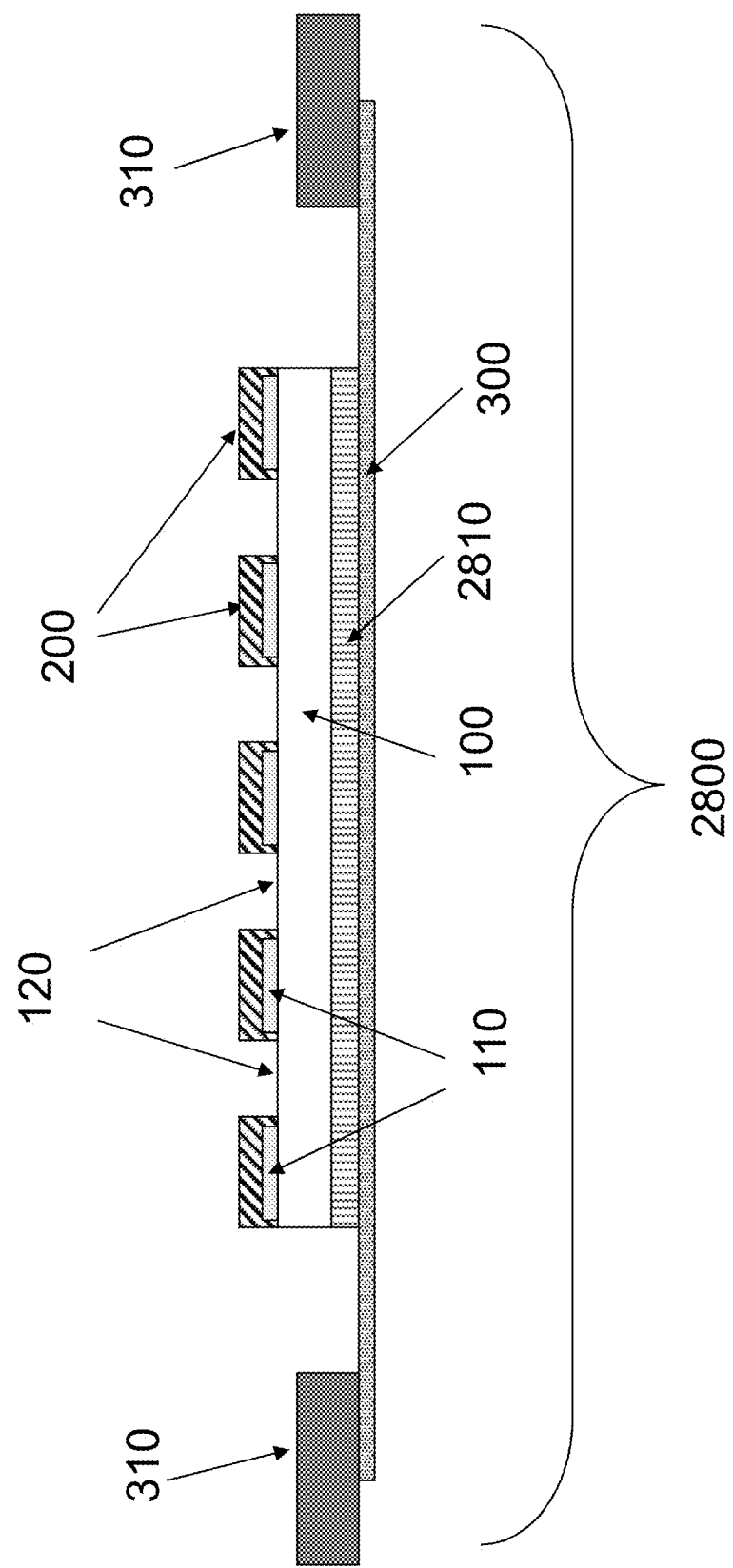
FIG. 10 is a schematic view of a work piece according to one embodiment of the present invention.

FIG. 10 shows an example of a work piece (2800). The work piece (2800) is similar to work piece (320) with the addition of at least one composite layer (2810) to be singulated. The work piece can contain a substrate (100) that contains at least one device structure (110) and at least one street region (120). The device structure (110) can be at least partially covered by a protective film (200).

In all embodiments, the composite layer (2810) can be composed of more than one component. The components of the composite film can differ from one another by chemical property (e.g., composition) or physical property (e.g., material phase, material structure, etc.) or both. The composite layer (2810) can be less than 100 microns thick. The composite layer (2810) can be less than 50 microns thick. The composite layer (2810) can be less than 25 microns thick In all embodiments, a composite material can contain carbon (e.g., polymeric materials, graphite, SiC, etc.). A composite material can contain silicon (e.g., Si, $SiO_2$, SiC, SiN, etc.). A composite material can contain a metal.

In all embodiments, a composite layer can be in contact with the substrate (100). A composite layer can be in contact with the support film (300). A composite material can be in contact with both the substrate (100) and the support film (300). A composite film can be adhesively attached to the substrate (100). The composite layer (2810) can be interposed between the substrate (100) and the support film. A composite layer can be a die attach film (DAF). The composite film can be a DAF that contains a filler material. The DAF filler material can contain Si. The DAF filler material can be $SiO_2$.

The composite layer can contain a material that requires an ion-assisted plasma etch mechanism to etch in a plasma. The composite layer can contain a material that is permeable to vapor hydrogen fluoride.

A composite material can contain a matrix component. The matrix component can contain a metal. The matrix component can contain carbon (e.g., polymer, etc.) The matrix component can be a polymeric matrix. The polymer matrix can be a thermoset. The polymer matrix can be a thermoplastic. The polymeric matrix can contain any of the following resins: epoxy, polyimide, polyamide, polyester, etc. The matrix can contain more than one component (e.g., resin, copolymers, blended polymers, etc.). The matrix component can be carbon. The matrix component can encapsulate a filler component.

The composite material can contain a composite reinforcement (e.g., filler, etc.). The reinforcement material can comprise greater than 5% of the composite material. The reinforcement material can comprise greater than 25% of the composite material. The reinforcement material can comprise greater than 50% of the composite material. The reinforcement material can comprise greater than 75% of the composite material. The reinforcement material can comprise greater than 90% of the composite material. The reinforcement material can be in discrete domains within the composite material (e.g., filler particles). The composite reinforcement can contain a wide range of materials including carbon-containing materials, silicon-containing materials, metal-containing materials, ceramic, etc. The composite reinforcement can contain silicon dioxide ($SiO_2$). The composite reinforcement can have isotropic or anisotropic composition. The composite material can be a fiber reinforced composite. A fiber reinforced composite can contain long fibers, short fibers, or a combination of both. The composite material can be a flake reinforced composite. The composite material can be a particle reinforced composite. The particle reinforced composite can contain spherically shaped particles. The particles can be solid, hollow, or a combination of both. The composite material can be a laminar reinforced composite.

FIGS. 11A and 11B show the work piece (2800) at various stages in a singulation process.

FIG. 11A shows a work piece (2800) where substrate material (100) has been removed in a street region (120). A substrate etch process can be used to remove substrate material from at least one street area (120). The substrate removal process can remove substrate material (100) from substantially all street regions (120). The substrate removal process can remove all substrate material from at least one street region. The substrate removal process can remove substantially all substrate material form substantially all street regions. During the substrate etch process, the work piece temperature is typically held below a maximum value that might damage the support film tape. Many support films (e.g., dicing tapes) are compatible up to approximately 100° C. Some support films can be compatible to 200° C. and greater.

The substrate etch process can be a vacuum process. The substrate etch process can be a plasma etch process. The plasma etch process can be a cyclical process (e.g., Bosch process, deep reactive ion etch (DRIE) process, time division multiplex (TDM) process, etc.). The substrate etch process can be at least partially anisotropic. The substrate etch process can be completely anisotropic.

The substrate etch process can expose at least a portion of a composite film (120) overlapped by a street region (120). The substrate etch process can expose all of the composite layer overlapped by a street region (120).

The substrate etch process can be designed to remove a portion of substrate material overlapped by the protective material (200) (e.g., the substrate etch feature profile can be re-entrant. In other words, the width of the substrate etch feature (e.g., dicing street in the substrate) created by the substrate etch can be narrower at the substrate surface that contains the device (110) compared the feature width at the opposing face of the substrate)

The substrate etch process can remove the substrate material faster than the composite material (e.g., the substrate etch process can have a substrate:composite etch selectivity (rate of substrate removal/rate of composite film removal) greater than one). The substrate etch process can have a substrate:composite etch selectivity great than 10. The substrate etch process can have a substrate:composite etch selectivity great than 100. The composite material can act as an etch stop for the substrate etch process.

The substrate etch process can etch the composite material. The substrate can remove a portion of the composite material. The substrate removal process by itself does not expose the support film in a street region where the composite film overlaps the street region. The substrate etch process alone does not etch through the composite film.

FIG. 11B shows a point in the dicing process flow where the composite film (2810) has been at least partially removed in at least one street region (120). The composite film (2810) can be completely removed in at least one street region (120). The composite layer (2810) can be damaged or removed in order to singulate the die. The composite film can be completely removed in the street regions (120).

Figure 12:
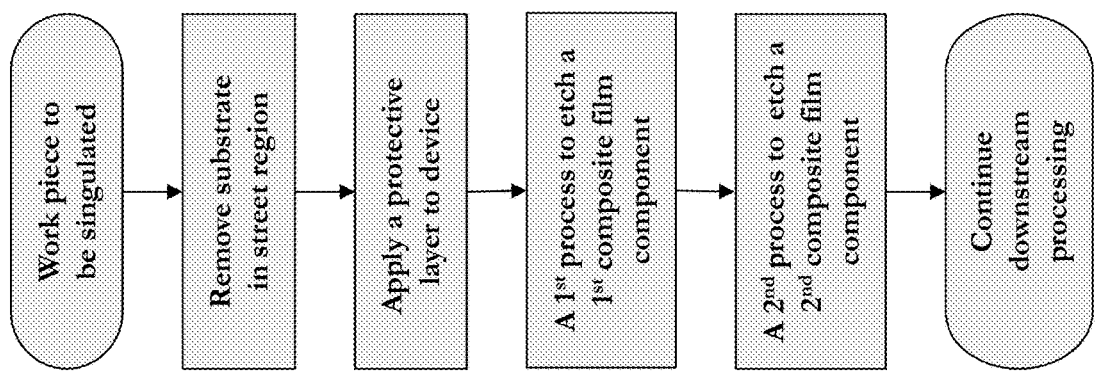
FIG. 12A is a flow chart of a portion of an improved substrate dicing sequence according to one embodiment of the present invention.
FIG. 12B is a flow chart of a portion of an improved substrate dicing sequence according to one embodiment of the present invention.
Figure 12:
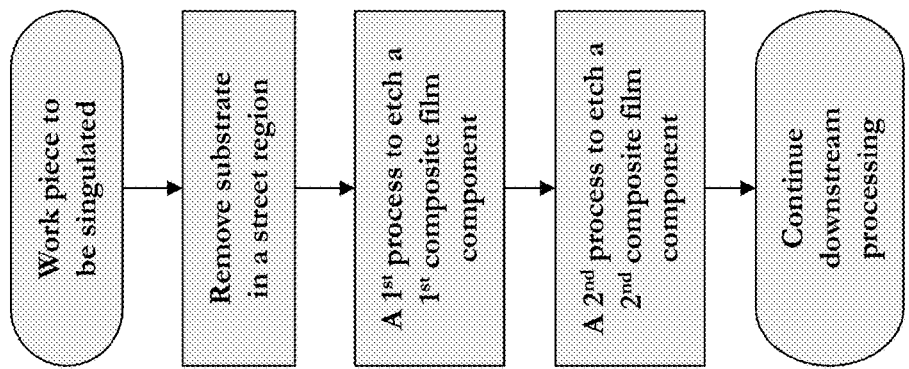

FIG. 12A is a flow chart of a portion of an improved substrate dicing sequence. Once the substrate material has been removed in at least one street region (120), the composite film needs to be processed to continue the singulation process. The composite film process can be an etch process. The composite film process can consist of multiple steps.

In order to process the composite film, the improved process can use a first process to etch a first component of the composite film. The first process can selectivity etch a first component of the composite film. The selectivity between two materials for a removal process is defined as the ratio of the process material removal rates of the two materials. The process selectivity for the first process (e.g., the removal rate of first composite film component/removal rate of another composite film component (first component: another component)) can be greater than 1:1. The first component: another component selectivity for the first process can be greater than 10:1. The first component: another component selectivity for the first process can be greater than 100:1. The first composite film component can be a reinforcement component.

The first process can remove material in a manner that is at least partially isotropic. The first removal process can be completely isotropic.

The first process can remove a first composite film component from at least a portion of the composite film. The first process can remove the first component from at least a portion of the composite film where the composite film is not overlapped by the substrate. The first process can remove at least a portion of the composite film overlapped by a street region. The first process can remove the first component of the composite film overlapped by a street region. The first process can remove all of the first component of the composite material in the composite material overlapped by street regions. The first process can removal substantially all of the first composite component from at least a portion of the composite film.

The first process can be selective to the substrate (e.g., removal rate of first composite film component/removal rate of the substrate (first component: substrate) is greater than 1:1). The first process first component: substrate selectivity can be greater than 10:1. The first process first component: substrate selectivity can be greater than 100:1.

The first process can be selective to the support film (e.g., removal rate of the first composite film component/removal rate of the support film (first component: support film) is greater than 1:1). The first process first component: support film selectivity can be greater than 10:1. The first process first component: support film selectivity can be greater than 100:1.

The first process can be a vapor phase process. The first process can be a process that does not contain a plasma. The first process can include a fluorine-containing process gas. The fluorine-containing process gas can be hydrogen fluoride vapor (VHF). At least one reactant in the first process can diffuse through a component of the composite material (e.g., VHF can readily diffuse through some types of polymer layers). The first process can be capable of removing a first composite material that is not exposed (e.g., the first composite is embedded within the composite material—for example a VHF containing process for the removal of $SiO_2$ within a $SiO_2$ reinforced composite with a polymeric matrix). It is preferred that first composite material etch process does not damage the device. The first process can be a vacuum process. The pressure of the first process can be higher than the pressure in the substrate etch process.

Following a first process, a second process can be applied to the composite film. The second process can be an etch process. The second process can be a plasma etch process. The second process can remove a second component of the composite film. The second process can selectively remove a second component of the composite film. The second process can remove at least a portion of the second component of the composite film. The second process can be a vacuum process. The second process can be at a lower pressure than the first process.

The second process can employ a different process chemistry from the first process. The second process can contain at least one different process gas than the first process. The second process can contain more than one different process gas than the first process. The second process may have no common process gases with the first process. The second process can utilize an oxygen containing reactant (e.g., $O_2$, $O_3$, $CO_2$, CO, $SO_2$, etc.). The second process can utilize a nitrogen containing reactant (e.g., $N_2$, $N_2O$, $C_xH_yOH$, etc.). The second process can utilize a hydrogen containing reactant (e.g., $H_2$, $NH_3$, $H_2O$, etc.).

In embodiments containing a work piece (2800), the process selectivity for the second process (e.g., the removal rate of second composite film component/removal rate of another composite film component (second component: another component)) can be greater than 1:1. The second component: another component selectivity for the second process can be greater than 10:1. The second component: another component selectivity for the second process can be greater than 100:1. The second composite film component can be a matrix component.

The second process can remove material in a manner that is at least partially anisotropic. The second process can be completely anisotropic. The second process can be at least partially anisotropic. The second process can remove the second component faster in the direction perpendicular to the plane of the support film than the direction parallel to the plane of the tape. The second process can be isotropic.

The second process can remove a second composite film component from at least a portion of the composite film. The second process can remove the second component from at least a portion of the composite film where the composite film is not overlapped by the substrate. The second process can remove at least a portion of the composite film overlapped by a street region. The second process can remove the second component of the composite film overlapped by a street region. The second process can remove all of the second component of the composite material in the composite material overlapped by street regions. The second process can removal substantially all of the second composite component from at least a portion of the composite film.

The second process can be selective to the substrate (e.g., removal rate of second composite film component/removal rate of the substrate (second component: substrate) is greater than 1:1). The second process second component: substrate selectivity can be greater than 10:1. The second process second component: substrate selectivity can be greater than 100:1.

The second process can be non-selective to the support film (e.g., removal rate of the second composite film component/removal rate of the support film (second component: support film) is less than or equal to 1:1). The second process does not etch completely through the support film. The second process may etch into the support film. The second process may etch into the support film in regions overlapped by at least one street region. The second process may etch into the support film in all regions overlapped by all street regions. The second process may etch less than 10 microns deep into the support film. The second process may etch less than approximately 10 microns deep in regions overlapped by a street region. In the case where the second process is not completely isotropic, the second process may remove at least a portion of the second component in at least one region overlapped by the substrate.

FIG. 12B shows another embodiment of the invention. It is preferred that the first and second processes do not damage the device. FIG. 12B illustrates an embodiment of the invention where at least one of the composite material etch processes may cause damage to the device. In this embodiment, a barrier film can be applied to the device prior to the composite film processing step. The barrier film can be applied prior to the substrate etch process. The barrier film can be applied prior to the substrate being assembled into a work piece. The barrier film can be applied after the substrate removal process. The barrier film protects the device from being degraded by at least one step of the composite film removal process. The barrier film can be applied by a vacuum coating process. The barrier film can be silicon containing. The barrier film can be SiN. The barrier film can be a silicon rich SiN film. The barrier film can be silicon (e.g., amorphous Si, etc.). The barrier film can be carbon-containing. The barrier film can contain organic materials. The barrier film can contain polyimide. The barrier film can contain paralyne. The barrier film can be removed after the composite film removal process. After the substrate etch process has been performed, a first process etches a first component of the composite film. After the first process has been performed, a second process etches a second component of the composite film. After the second process has been performed, the work piece can be sent downstream for further processing.

Figure 13:
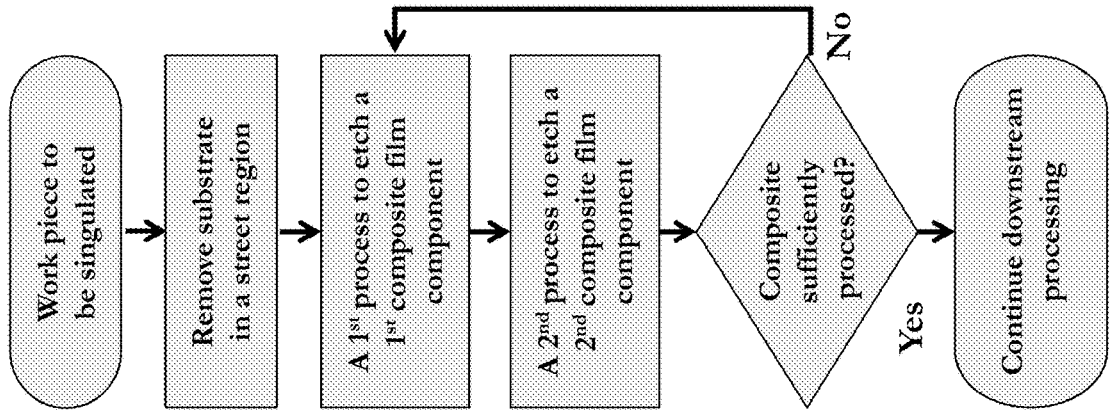
FIG. 13A is a flow chart of a portion of an improved substrate dicing sequence according to one embodiment of the present invention.
FIG. 13B is a flow chart of a portion of an improved substrate dicing sequence according to one embodiment of the present invention.
Figure 13:
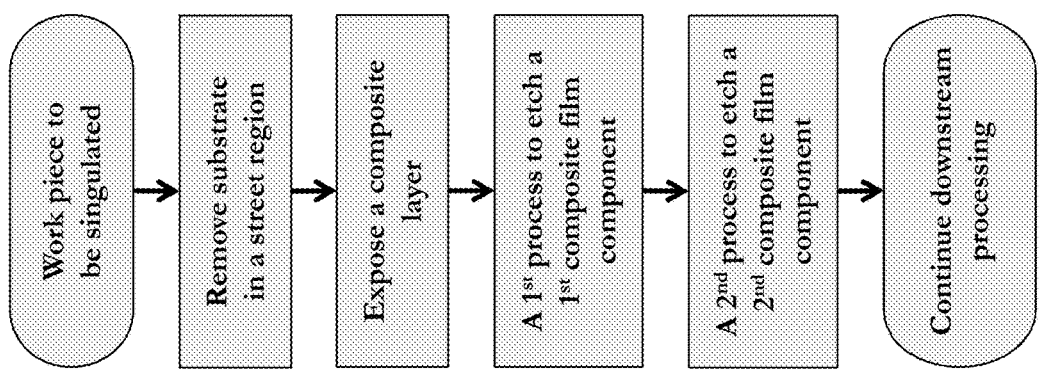

FIG. 13A shows another embodiment of the invention. In this embodiment substrate is removed in at least one street region exposing a composite layer. After the substrate etch process has been performed, a first process etches a first component of the composite film. After the first process has been performed, a second process etches a second component of the composite film. After the second process has been performed, the work piece can be sent downstream for further processing.

Figure 14:
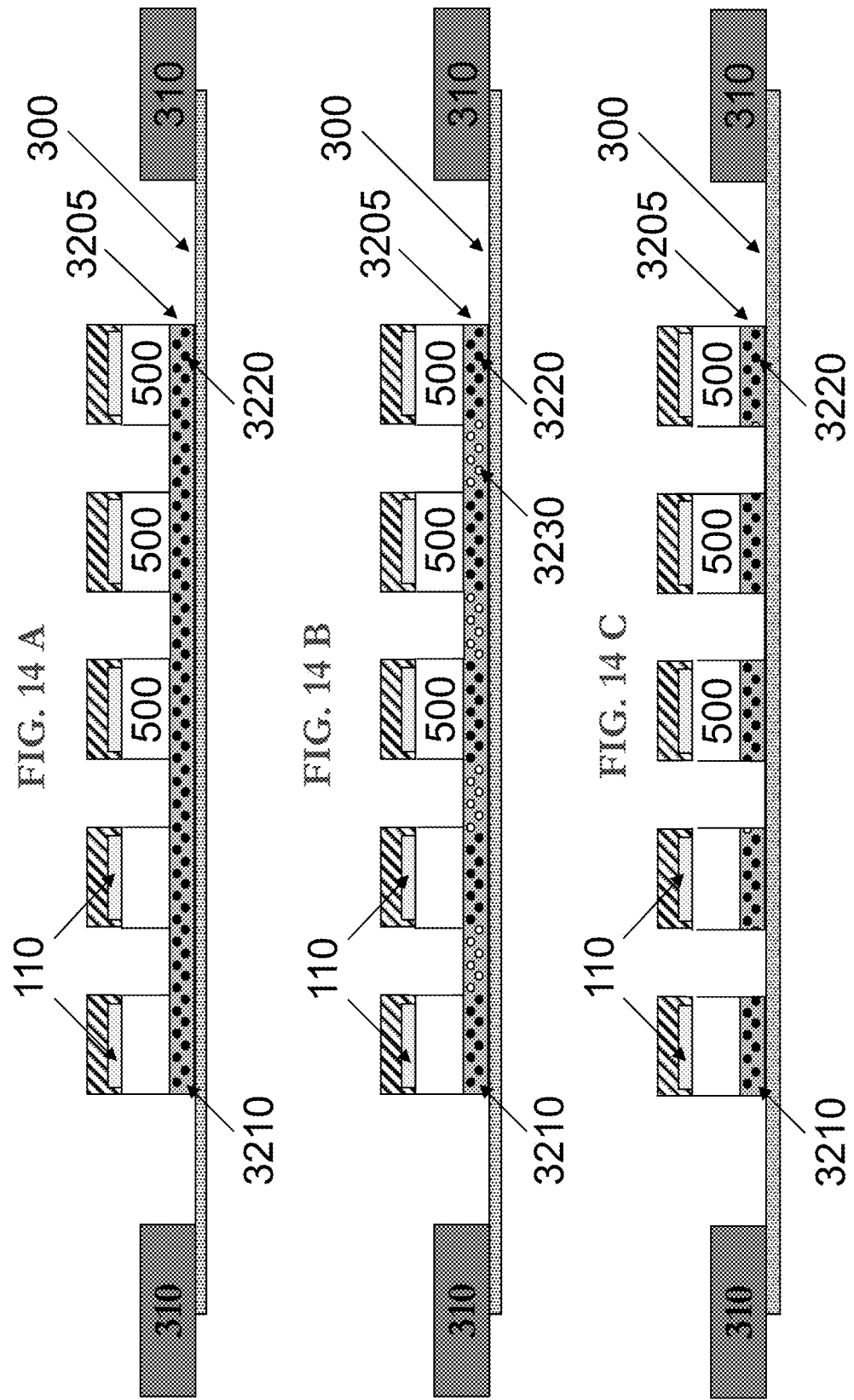
FIG. 14A is a schematic view of a work piece where the substrate material has been removed in the street regions.
FIG. 14B is a schematic view of a work piece after a first process has been performed to remove the first component of the composite film.
FIG. 14C is a schematic view of a work piece after the second process has been performed to remove a second component of the composite film.

FIG. 13B shows yet another embodiment of the invention. In this embodiment, the substrate material is removed from at least one street region. After the substrate etch process has been performed, a first process etches a first component of the composite film. After the first process has been performed, a second process etches a second component of the composite film. Following the second process, if the composite layer is not sufficiently processed, the first process and second process can be repeated. The first process and second process can be repeated at least one time. A looped process can contain one process step (e.g., a one-step loop that is morphed or changed between at least one subsequent iteration through the step). A looped process can contain at least two process steps. A looped process can execute at least one process step then repeats at least one of the process steps. FIG. 13B shows an example of a looped process. In a looped process, at least one process step can be repeated more than one time. If a process step is repeated in a looped process, the process conditions can be the identical to the previous iteration (or loop). The process conditions of at least one process step can change between two repeated process loops. The repeated process conditions can change between more than two repeated process loops. The repeated process conditions can change between every repeated process loop. The repeated process conditions of at least one process step can change in every loop. FIGS. 14A-C illustrate the work piece condition for a portion of the inventive process. FIG. 14A shows a work piece where the substrate material has been removed in the street regions. The composite layer (3205) has been exposed in the street regions. The composite film in FIG. 14A consists of a first component (3220) and a second component (3210). FIG. 14B shows the work piece after a first process has been performed to remove the first component (3220) of the composite film (3205). The first component has been removed from the composite film (3205) in areas where the composite film overlaps the street region. The removal of the first component (3220) can leave a void (3230) in the composite material (3210). FIG. 14C shows the work piece after the second process has been performed to remove a second component (3210) of the composite film (3205). The second component has been removed in areas where the composite film overlaps the street region. In FIG. 14C, the die has been singulated.

Figure 15:
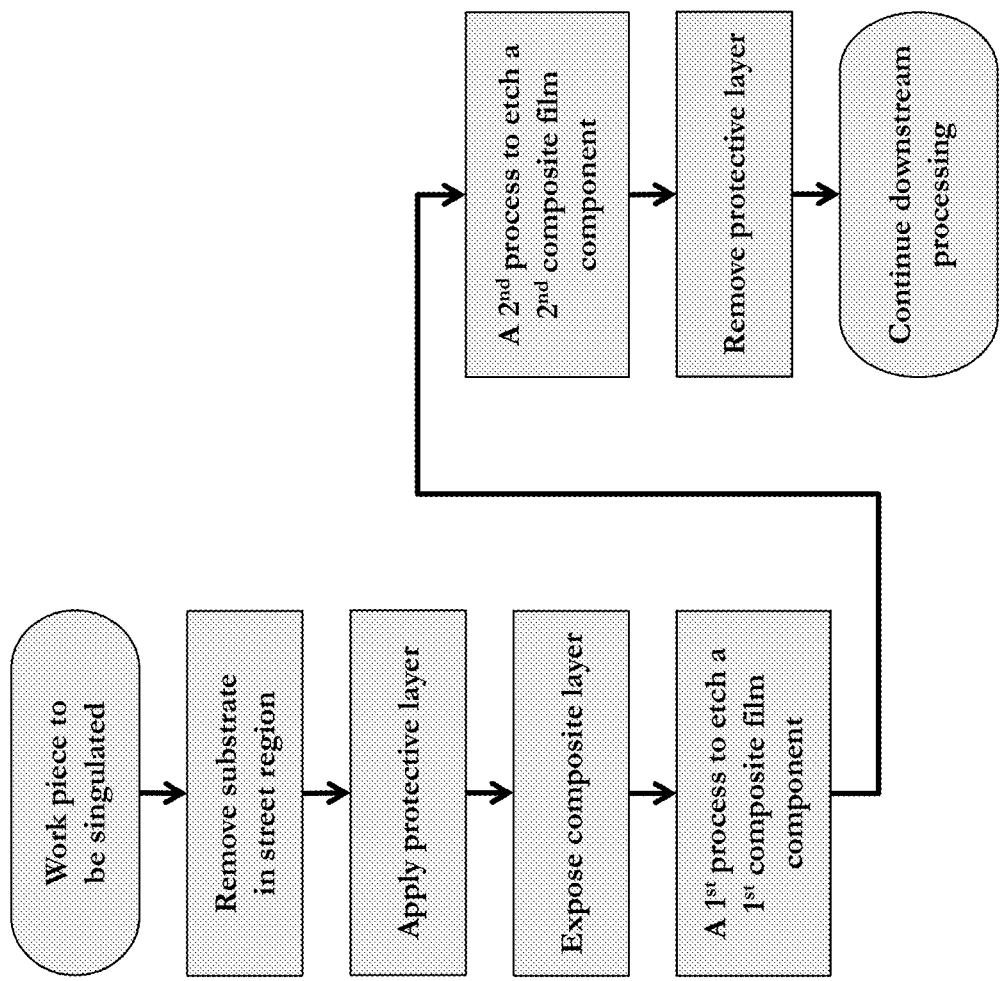
FIG. 15 is a flow chart of a portion of an improved substrate dicing sequence according to one embodiment of the present invention.

FIG. 15 shows another embodiment of the invention. In this embodiment, a substrate removal process is performed to remove substrate material from a street region. After substrate material has been removed, a barrier layer can be added to protect the device from damage from subsequent processes. It is important to note that the barrier film can be applied prior to the substrate removal process. After the composite layer has been exposed, a first process is performed to etch a first composite film component. A second process is performed to etch a second composite film component. The barrier layer on the device can be removed. The work piece can sent downstream for additional processing.

FIGS. 16A-F show a section of the work piece for a process flow illustrated in FIG. 15. FIG. 16A shows the work piece after substrate material in a street region has been removed. The composite film has been exposed in a street region. FIG. 16B shows a barrier film has been applied to protect the device. The barrier film can coat the substrate surfaces exposed during the substrate removal process. The barrier film can coat the exposed surface of the composite film. Since the barrier film is designed to resist the composite film removal process, the barrier film should be removed from the composite film in areas to be removed. The barrier film can be removed from the street region. FIG. 16C shows a portion of the work piece where the barrier film has been removed from a portion of the street region, exposing the composite film. FIG. 16D shows the work piece after a first process has been performed to remove a first component (3220) of the composite film (3420). The removal of the first component (3220) can leave a void (3230) in the composite film. FIG. 16E shows a portion of the work piece where the second component of a composite film has been removed with a second process. The support film (300) has been exposed. FIG. 16F shows a portion of the work piece where the barrier film has been removed. The die (500) has been singulated at this point and can be sent down stream for further processing.

In all embodiments, the substrate etch process and the first process can be performed in the same process chamber. The first process and the second process can be performed in the same process chamber. The substrate etch process and the second process can be performed in the same chamber. The substrate etch process, the first process, and the second process can all be performed in the same chamber.

In cases where the substrate etch process and the first process are both vacuum processes, both processes can be performed without exposing the workpiece to atmosphere (e.g., a substrate etch process at vacuum followed by a first process at vacuum with any operations (e.g., wafer transport, etc.) between the substrate etch and first process also in vacuum).

In cases where the substrate etch process and the second process are both vacuum processes, both processes can be performed without exposing the workpiece to atmosphere (e.g., a substrate etch process at vacuum followed by a second process at vacuum with any operations (e.g., wafer transport, etc.) between the substrate etch and first process also in vacuum).

In cases where the first process and the second process are both vacuum processes, both processes can be performed without exposing the workpiece to atmosphere (e.g., a first etch process at vacuum followed by a second process at vacuum with any operations (e.g., wafer transport, etc.) between the substrate etch and first process also in vacuum).

In cases where the substrate etch, first process and the second process are all vacuum processes, the processes can all be performed without exposing the workpiece to atmosphere (e.g., a substrate etch, first etch process, and a second process at vacuum with any operations (e.g., wafer transport, etc.) between the processes also in vacuum).

Figure 16:
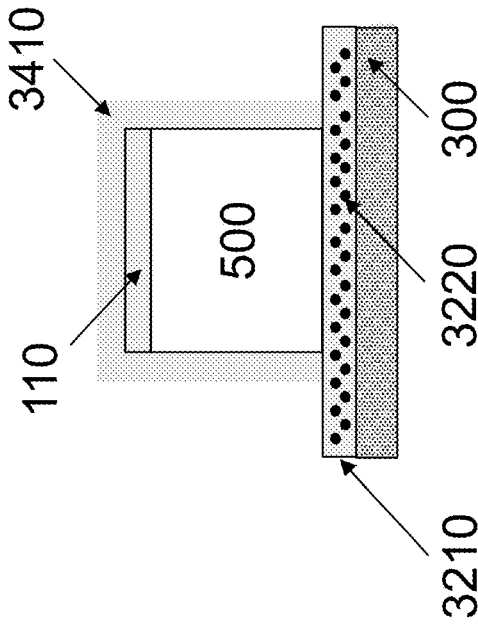
FIG. 16A is a schematic view of a work piece after substrate material in a street region has been removed.
FIG. 16B is a schematic view of a barrier film that has been applied to protect the device.
FIG. 16C is a schematic view of a portion of the work piece where the barrier film has been removed from a portion of the street region, exposing the composite film.
FIG. 16D is a schematic view of a work piece after a first process has been performed to remove a first component of the composite film.
FIG. 16E is a schematic view of a portion of the work piece where the second component of a composite film has been removed with a second process.
FIG. 16F is a schematic view of a portion of the work piece where the barrier film has been removed.
Figure 16:
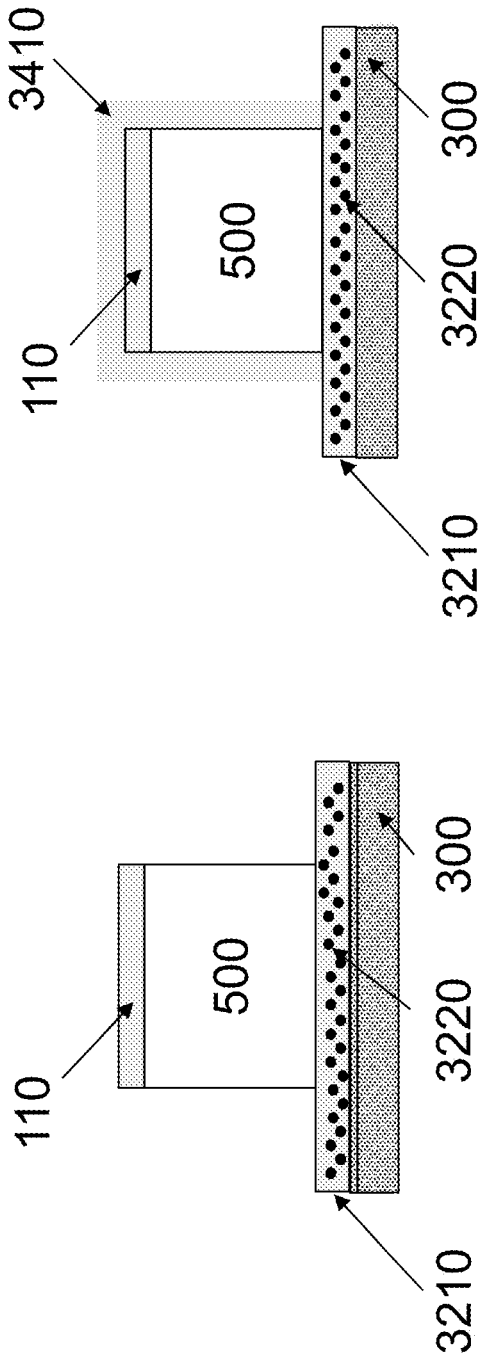
Figure 16:
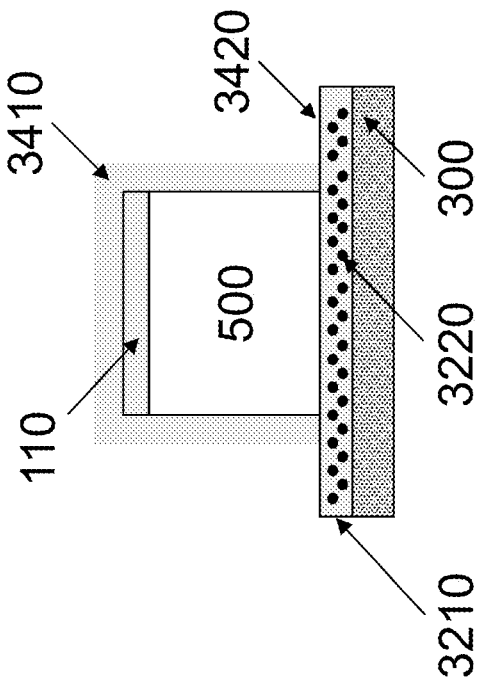
Figure 16:
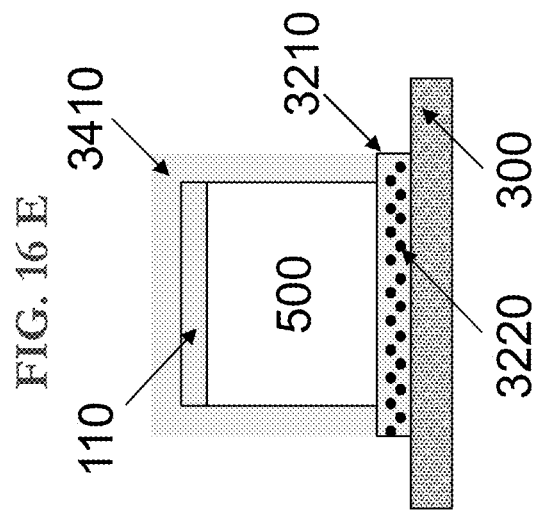
Figure 16:
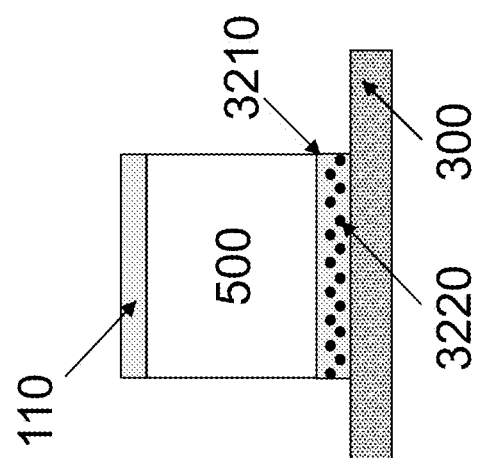
Figure 16:
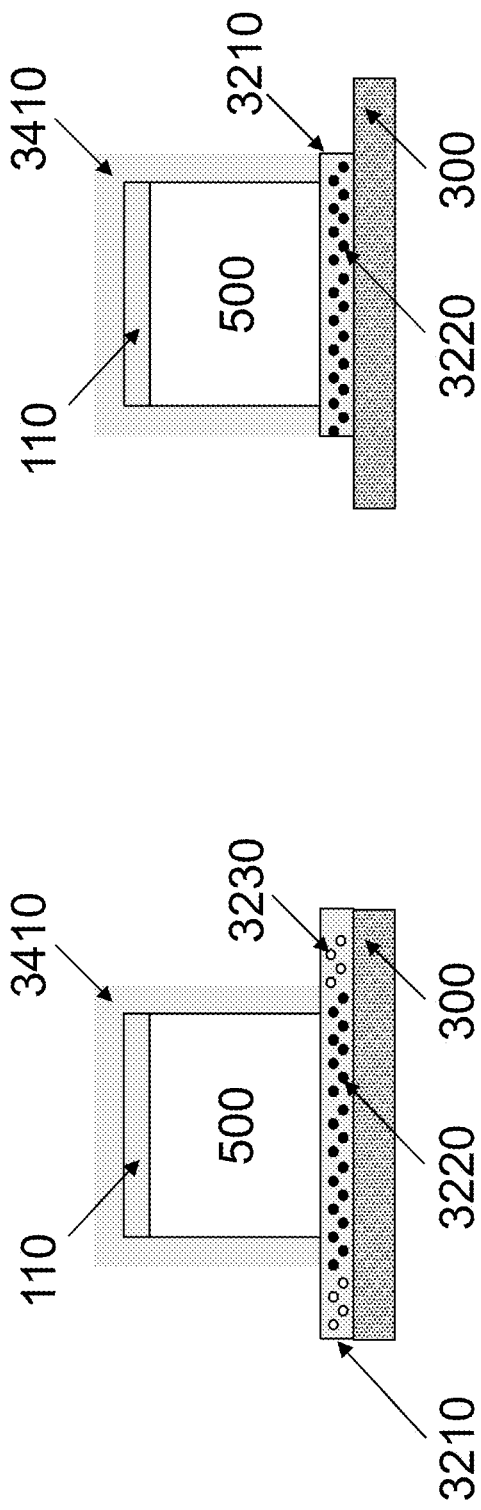

By way of example, FIG. 16 illustrates the invention as applied to a work piece that contains a die attach film (DAF)—see FIG. 16A. The DAF film (3205), contains approximately 50% of an $SiO_2$ filler (3220) in an epoxy-containing polymer matrix (3210). The $SiO_2$ particles (3220) were approximately 1 micron in diameter. A plasma etch process using a deep reactive ion etch (DRIE) etch process was used to remove the substrate material (not shown) from the street regions. The plasma etch process was implemented on a commercially available MDS-100 plasma etch system by Plasma-Therm, LLC and used three steps per loop as shown in the table below:

|  | Deposition | Etch A | Etch B |
| --- | --- | --- | --- |
| Time <sec> | 1-10 | 1-5 | 1-20 |
| Pressure <mtorr> | 10-150 | 10-150 | 50-2000 |
| $SF_6$ Flow <sccm> | 0-100 | 0-300 | 200-2000 |
| $C_4F_8$ Flow <sccm> | 50-200 | 0-100 | 0-100 |
| $O_2$ Flow <sccm> | 0-100 | 0-100 | 0-500 |
| Ar Flow <sccm> | 0-200 | 0-200 | 0-200 |
| RF Bias Power <W> | 0-100 | 0-1000 | 0-200 |
| ICP Power <W> | 500-5000 | 500-5000 | 1000-10000+ |

For the example above, after the plasma etch removes the substrate material in the street regions, the work piece is exposed to a first process containing VHF to remove the $SiO_2$ filler from the composite DAF material (3205). The VHF material readily removes the $SiO_2$ particles in the exposed street regions by diffusing through the polymer matrix of the DAF. The VHF process removes the $SiO_2$ particles with minimal loss of the polymer matrix and the substrate. VHF processing for etching $SiO_2$ sacrificial films is known in the art. An example of VHF process parameters is shown in the table below:

|  | VHF Process |
| --- | --- |
| Time <sec> | 10-1200 |
| Pressure <torr> | 0.1-200 |
| Temperature <° C.> | −10-+100 |

For the example above, after the VHF removes the $SiO_2$ fillers from the composite DAF material, a single step plasma etch process is applied in order to fully remove the polymer matrix. An example of this single step plasma etch process is described in the table below:

|  | Plasma Etch |
| --- | --- |
| Time <sec> | 60-1200 |
| Pressure <mtorr> | 10-150 |
| $O_2$ Flow <sccm> | 0-200 |
| Ar Flow <sccm> | 0-200 |
| RF Bias Power <W> | 0-500 |
| ICP Power <W> | 500-5000 |

An example of a composite film process that might damage a device is the use of a vapor hydrogen fluoride (VHF) process with a device that contains an $SiO_2$ layer. The VHF molecule will readily etch $SiO_2$ films and may degrade device performance. Even in the case where an $SiO_2$ device layer is covered by an organic layer (e.g., resist, water soluble polymer, etc.), the organic layer may be permeable to VHF and consequently not protect the $SiO_2$ layer from VHF etching. The VHF molecule can diffuse through many organic (e.g., polymeric) films. In this case a barrier layer can provide the device protection from damage from the VHF etchant.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method for dicing a semiconductor substrate on a composite die attach material, the method comprising:
   providing a work piece having a support film, a frame and the semiconductor substrate, the semiconductor substrate having a top surface and a bottom surface, the top surface of the semiconductor substrate having at least one die region and at least one street region;
   providing the composite die attach material interposed between the bottom surface of the semiconductor substrate and the support film;
   applying a barrier film to the at least one die region prior to etching an $SiO_2$ filler from the composite die attach material;
   etching substrate material from the at least one street region to expose a portion of the composite die attach material using a deep reactive ion etch process;
   etching the $SiO_2$ filler from the composite die attach material using a hydrogen fluoride vapor process; and
   etching a polymer matrix of the exposed portion of the composite die attach material using an oxygen containing plasma etch process.

2. The method according to claim 1 wherein the barrier film contains polyimide.

3. The method according to claim 1 wherein the barrier film contains silicon.

4. The method according to claim 1 wherein the barrier film contains an organic material.

5. The method according to claim 1 further comprising removing a portion of the $SiO_2$ filler from the composite die attach material during the step of etching substrate material from the at least one street region.

* * * * *